United States Patent [19]
Noble et al.

[11] Patent Number: 5,914,511
[45] Date of Patent: *Jun. 22, 1999

[54] CIRCUIT AND METHOD FOR A FOLDED BIT LINE MEMORY USING TRENCH PLATE CAPACITOR CELLS WITH BODY BIAS CONTACTS

[75] Inventors: Wendell P. Noble, Milton, Vt.; Leonard Forbes, Corvallis, Oreg.

[73] Assignee: Micron Technology, Inc., Boise, Id.

[*] Notice: This patent is subject to a terminal disclaimer.

[21] Appl. No.: 08/944,312

[22] Filed: Oct. 6, 1997

[51] Int. Cl.$^6$ .................................................. H01L 27/108
[52] U.S. Cl. ........................... 257/302; 257/296; 257/301
[58] Field of Search ................................... 257/296, 301, 257/302, 304; 438/239, 242, 243

[56] References Cited

U.S. PATENT DOCUMENTS

| | | | |
|---|---|---|---|
| 4,051,354 | 9/1977 | Choate | 235/312 |
| 4,604,162 | 8/1986 | Sobczak | 156/657 |
| 4,663,831 | 5/1987 | Birrittella et al. | 129/576 E |
| 4,673,962 | 6/1987 | Chatterjee et al. | 357/23.6 |
| 4,761,768 | 8/1988 | Turner et al. | 365/201 |
| 4,766,569 | 8/1988 | Turner et al. | 365/185 |
| 4,920,065 | 4/1990 | Chin et al. | 257/302 |
| 4,958,318 | 9/1990 | Harari | 365/149 |
| 4,987,089 | 1/1991 | Roberts | 437/34 |
| 5,001,526 | 3/1991 | Gotou | 257/302 |
| 5,006,909 | 4/1991 | Kosa | 357/23.6 |
| 5,017,504 | 5/1991 | Nishimuro et al. | 437/40 |
| 5,021,355 | 6/1991 | Dhong et al. | 437/35 |
| 5,028,977 | 7/1991 | Kenneth et al. | 357/43 |

(List continued on next page.)

FOREIGN PATENT DOCUMENTS 363066963  3/1988  Japan ..................................... 257/305

OTHER PUBLICATIONS

Hu, G., et al., "Evening Panel Discussion—Will Flash Memory Replace Hard Disk Drive", *IEDM Technical Digest*, (Dec. 11, 1994).

Asai, S., et al., "Technology Challenges for Integration Near and Below 0.1 $\mu$m", *Proceedings of the IEEE*, 85, Special Issue on Nanometer–Scale Science & Technology, 505–520, (Apr. 1997).

Banerjee, S.K., et al., "Characterization of Trench Transistors for 3–D Memories", *1986 Symposium on VLSI Technology, Digest of Technical Papers*, San Diego, CA, 79–80, (May 28–30, 1986).

Blalock, T.N., et al., "A High–Speed Sensing Scheme for 1T Dynamic RAM's Utilizing the Clamped Bit–Line Sense Amplifier", *IEEE Journal of Solid–State Circuits*, 27, 618–625, (Apr. 1992).

(List continued on next page.)

*Primary Examiner*—Tom Thomas
*Assistant Examiner*—William Hughes
*Attorney, Agent, or Firm*—Schwegman, Lundberg, Woessner & Kluth P.A.

[57] ABSTRACT

A memory cell for a memory array in a folded bit line configuration. The memory cell includes an access transistor formed in a pillar of single crystal semiconductor material. The access transistor has first and second source/drain regions and a body region that are vertically aligned. A body contact is coupled to the body region of the access transistor that provides a body bias to the access transistor. The access transistor further includes a gate coupled to a word line disposed adjacent to the body region. A passing word line is separated from the gate by an insulator for coupling to other memory cells adjacent to the memory cell. A trench capacitor is also included. The trench capacitor includes a first plate that is formed integral with the first source/drain region of the access transistor and a second plate that is disposed adjacent to the first plate and separated from the first plate by a gate oxide.

19 Claims, 35 Drawing Sheets

U.S. PATENT DOCUMENTS

| | | | |
|---|---|---|---|
| 5,057,896 | 10/1991 | Gotou | 257/296 |
| 5,072,269 | 12/1991 | Hieda | 257/302 |
| 5,102,817 | 4/1992 | Chatterjee et al. | 437/47 |
| 5,110,752 | 5/1992 | Lu | 437/47 |
| 5,156,987 | 10/1992 | Sandhu et al. | 437/40 |
| 5,177,028 | 1/1993 | Manning | 437/41 |
| 5,177,576 | 1/1993 | Kimura et al. | 257/71 |
| 5,202,278 | 4/1993 | Mathews et al. | 437/47 |
| 5,208,657 | 5/1993 | Chatterjee et al. | 257/302 |
| 5,216,266 | 6/1993 | Ozaki | 257/302 |
| 5,223,081 | 6/1993 | Doan | 156/628 |
| 5,266,514 | 11/1993 | Tuan et al. | 437/52 |
| 5,316,962 | 5/1994 | Matsuo et al. | 438/242 |
| 5,320,880 | 6/1994 | Sandhu et al. | 427/578 |
| 5,327,380 | 7/1994 | Kersh, III et al. | 365/195 |
| 5,376,575 | 12/1994 | Kim et al. | 437/52 |
| 5,391,911 | 2/1995 | Beyer et al. | 257/522 |
| 5,392,245 | 2/1995 | Manning | 365/200 |
| 5,393,704 | 2/1995 | Huang et al. | 437/203 |
| 5,396,093 | 3/1995 | Lu | 257/306 |
| 5,410,169 | 4/1995 | Yamamoto et al. | 257/301 |
| 5,414,287 | 5/1995 | Hong | 257/316 |
| 5,422,499 | 6/1995 | Manning | 257/67 |
| 5,427,972 | 6/1995 | Shimizu et al. | 437/52 |
| 5,438,009 | 8/1995 | Yang et al. | 437/52 |
| 5,440,158 | 8/1995 | Sung-Mu | 257/314 |
| 5,445,986 | 8/1995 | Hirota | 437/60 |
| 5,460,316 | 10/1995 | Hefele | 228/39 |
| 5,460,988 | 10/1995 | Hong | 437/43 |
| 5,466,625 | 11/1995 | Hsieh et al. | 437/52 |
| 5,483,094 | 1/1996 | Sharma et al. | 257/316 |
| 5,483,487 | 1/1996 | Sung-Mu | 365/185.33 |
| 5,492,853 | 2/1996 | Jeng et al. | 437/60 |
| 5,495,441 | 2/1996 | Hong | 365/185.01 |
| 5,497,017 | 3/1996 | Gonzales | 257/306 |
| 5,504,357 | 4/1996 | Kim et al. | 257/306 |
| 5,508,219 | 4/1996 | Bronner et al. | 437/52 |
| 5,508,542 | 4/1996 | Geiss et al. | 257/301 |
| 5,519,236 | 5/1996 | Ozaki | 257/302 |
| 5,528,062 | 6/1996 | Hsieh et al. | 257/298 |
| 5,574,299 | 11/1996 | Kim | 257/296 |
| 5,593,912 | 1/1997 | Rajeevakumar | 437/52 |
| 5,616,934 | 4/1997 | Dennison et al. | 257/67 |
| 5,640,342 | 6/1997 | Gonzalez | 365/156 |
| 5,644,540 | 7/1997 | Manning | 365/200 |
| 5,646,900 | 7/1997 | Tsukude et al. | 365/205 |
| 5,691,230 | 11/1997 | Forbes | 437/62 |

OTHER PUBLICATIONS

Bomchil, G., et al., "Porous Silicon: The Material and its Applications in Silicon–On–Insulator Technologies", *Applied Surface Science*, 41/42, 604–613, (1989).

Burnett, D., et al., "Implications of Fundamental Threshold Voltage Variations for High–Density SRAM and Logic Circuits", *1994 Symposium on VLSI Technology, Digest of Technical Papers*, Honolulu, HI, 15–16, (Jun. 4–7, 1994).

Burnett, D., et al., "Statistical Threshold–Voltage Variation and its Impact on Supply–Voltage Scaling", *SPIE*, 2636, 83–90, (1995).

Chen, M.J., et al., "Back–Gate Forward Bias Method for Low–Voltage CMOS Digital Cicuits", *IEEE Transactions on Electron Devices*, 43, 904–909, (Jun. 1986).

Chen, M.J., et al., "Optimizing the Match in Weakly Inverted MOSFET's by Gated Lateral Bipolar Action", *IEEE Transactions on Electron Devices*, 43, 766–773, (May 1996).

Chung, I.Y., et al., "A New SOI Inverter for Low Power Applications", *Proceedings of the 1996 IEEE International SOI Conference*, Sanibel Island, FL, 20–21, (Sep. 30–Oct. 3, 1996).

De, V.K., et al., "Random MOSFET Parameter Fluctuation Limits to Gigascale Integration (GSI)", *1996 Symposium on VLSI Technology, Digest of Technical Papers*, Honolulu, HI, 198–199, (Jun. 11–13, 1996).

Denton, J.P., et al., "Fully Depleted Dual–Gated Thin–Film SOI P–MOSFET's Fabricated in SOI Islands with an Isolated Buried Polysilicon Backgate", *IEEE Electron Device Letters*, 17, 509–511, (Nov. 1996).

Fong, Y., et al., "Oxides Grown on Textured Single–Crystal Silicon—Dependence on Process and Application in EEPROMs", *IEEE Transactions on Electron Devices*, 37, 583–590, (Mar. 1990).

Fuse, T., et al., "A 0.5V 200MHz 1–Stage 32b ALU Using a Body Bias Controlled SOI Pass–Gate Logic", *1997 IEEE International Solid–State Circuits Conference, Digest of Technical Papers*, 286–287, (1997).

Gong, S., et al., "Techniques for Reducing Switching Noise in High Speed Digital Systems", *Proceedings of the 8th Annual IEEE International ASIC Conference and Exhibit*, 21–24, (1995).

Hao, M.Y., et al., "Electrical Characteristics of Oxynitrides Grown on Textured Single–Crystal Silicon", *Appl. Phys. Lett.*, 60, 445–447, (Jan. 1992).

Harada, M., et al., "Suppresion of Threshold Voltage Variation in MTCMOS/SIMOX Circuit Operating Below 0.5 V", *1996 Symposium on VLSI Technology, Digest of Technical Papers*, Honolulu, HI, 96–97, (Jun. 11–13, 1996).

Hisamoto, D., et al., "A New Stacked Cell Structure for Giga–Bit DRAMs using Vertical Ultra–Thin SOI (Delta) MOSFETs", *1991 IEEE International Electron Devices Meeting, Technical Digest*, Washington, D.C., 959–961, (Dec. 8–11, 1991).

Hodges, D.A., et al., "MOS Decoders", In: *Analysis and Design of Digital Integrated Circuits, 2nd Edition*, McGraw–Hill Book Co., New York. 354–357. (1988).

Holman, W.T., et al., "A Compact Low Noise Operational Amplifier for a 1.2 λm Digital CMOS Technology", *IEEE Journal of Solid–State Circuits*, 30, 710–714, (Jun. 1995).

Hu, G., et al., "Will Flash Memory Replace Hard Disk Drive?", *1994 IEEE International Electron Device Meeting*, Panel Discussion, Session 24, Outline, 1 p., (Dec. 13, 1994).

Huang, W.L., et al., "TFSOI Complementary BiCMOS Technology for Low Power Applications", *IEEE Transactions on Electron Devices*, 42, 506–512, (Mar. 1995).

Jun, Y.K., et al., "The Fabrication and Electrical Properties of Modulated Stacked Capacitor for Advanced DRAM Applications", *IEEE Electron Device Letters*, 13, 430–432, (Aug. 1992).

Jung, T.S., et al., "A 117–mm$^2$ 3.3–V Only 128–Mb Multilevel NAND Flash Memory for Mass Storage Applications", *IEEE Journal of Solid–State Circuits*, 31, 1575–1582, (Nov. 1996).

Kang, H.K., et al., "Highly Manufacturable Process Technology for Reliable 256 Mbit and 1Gbit DRAMs", *IEEE International Electron Devices Meeting, Technical Digest*, San Francisco, CA, 635–638, (Dec. 11–14, 1994).

Kim, Y.S., et al., "A Study on Pyrolysis DMEAA for Selective Deposition of Aluminum", In: *Advanced Metallization and Interconnect Systems for ULSI Applications in 1995*, R.C. Ellwanger, et al., (eds.), Materials Research Society, Pittsburgh, PA, 675–680, (1996).

Kishimoto, T., et al., "Well Structure by High–Energy Boron Implantation for Soft–Error Reduction in Dynamic Random Access Memories (DRAMs)", *Japanese Journal of Applied Physics*, 34, 6899–6902, (Dec. 1995).

Kohyama, Y., et al., "Buried Bit–Line Cell for 64MB DRAMs", *1990 Symposium on VLSI Technology, Digest of Technical Papers*, Honolulu, HI, 17–18, (Jun. 4–7, 1990).

Koshida, N., et al., "Efficient Visible Photoluminescence from Porous Silicon", *Japanese Journal of Applied Physics*, 30, L1221–L1223, (Jul. 1991).

Lantz, II, L., "Soft Errors Induced By Alpha Particles", *IEEE Transactions on Reliability*, 45, 174–179, (Jun. 1996).

Lehmann, V., "The Physics of Macropore Formation in Low Doped n–Type Silicon", *J. Electrochem. Soc.*, 140, 2836–2843, (Oct. 1993).

MacSweeney, D., et al., "Modelling of Lateral Bipolar Devices in a CMOS Process", *IEEE Bipolar Circuits and Technology Meeting*, Minneapolis, MN, 27–30, (Sep. 1996).

Maeda, S., et al., "A Vertical Φ–Shape Transistor (VΦT) Cell for 1 Gbit DRAM and Beyond", *1994 Symposium of VLSI Technology, Digest of Technical Papers*, Honolulu, HI, 133–134, (Jun. 7–9, 1994).

Maeda, S., et al., "Impact of a Vertical φ–Shape Transistor (VφT) Cell for 1 Gbit DRAM and Beyond", *IEEE Transactions on Electron Devices*, 42, 2117–2123, (Dec. 1995).

Malaviya, S., *IBM TBD*, 15, p. 42, (Jul. 1972).

Nitayama, A., et al., "High Speed and Compact CMOS Circuits with Multipillar Surrounding Gate Transistors", *IEEE Transactions on Electron Devices*, 36, 2605–2606, (Nov. 1989).

Ohno, Y., et al., "Estimation of the Charge Collection for the Soft–Error Immunity by the 3D–Device Simulation and the Quantitative Investigation", *Simulation of Semiconductor Devices and Processes*, 6, 302–305, (Sep. 1995).

Oowaki, Y., et al., "New α–Particle Induced Soft Error Mechanism in a Three Dimensional Capacitor Cell", *IEICE Transactions on Electronics*, 78–C, 845–851, (Jul. 1995).

Oshida, S., et al., "Minority Carrier Collection in 256 M–bit DRAM Cell on Incidence of Alpha–Particle Analyzed by Three–Dimensional Device Simulation", *IEICE Transactions on Electronics*, 76–C, 1604–1610, (Nov. 1993).

Ozaki, T., et al., "A Surrounding Isolation–Merged Plate Electrode (Simple) Cell with Checkered Layout for 256Mbit DRAMs and Beyond", *1991 IEEE International Electron Devices Meeting*, Washington, D.C., 469–472, (Dec. 8–11, 1991).

Parke, S.A., et al., "A High–Performance Lateral Bipolar Transistor Fabricated on SIMOX", *IEEE Electron Device Letters*, 14, 33–35, (Jan. 1993).

Pein, H., et al., "A 3–D Sidewall Flash EPROM Cell and Memory Array", *IEEE Transactions on Electron Devices*, 40, 2126–2127, (Nov. 1993).

Pein, H., et al., "Performance of the 3–D Pencil Flash EPROM Cell and Memory Array", *IEEE Transactions on Electron Devices*, 42, 1982–1991, (Nov., 1995).

Pein, H.B., et al., "Performance of the 3–D Sidewall Flash EPROM Cell", *IEEE International Electron Devices Meeting, Technical Digest*, 11–14, (1993).

Richardson, W.F., et al., "A Trench Transistor Cross–Point DRAM Cell", *1985 IEEE International Electron Devices Meeting*, Washington, D.C., 714–717, (Dec. 1–4, 1985).

Sagara, K., et al., "A 0.72 $\mu m^2$ Recessed STC (RSTC) Technology for 256Mbit DRAMs Using Quarter–Micron Phase–Shift Lithography", *1992 Symposium on VLSI Technology, Digest of Technical Papers*, Seattle, WA, 10–11, (Jun. 2–4, 1992).

Saito, M., et al., "Technique for Controlling Effective Vth in Multi–Gbit DRAM Sense Amplifier", *1996 Symposium on VLSI Circuits, Digest of Technical Papers*, Honolulu, HI, 106–107, (Jun. 13–15, 1996).

Shah, A.H., et al., "A 4–Mbit DRAM with Trench–Transistor Cell", *IEEE Journal of Solid–State Circuits*, SC–21, 618–625, (Oct. 1986).

Shah, A.H., et al., "A 4Mb DRAM with Cross–Point Trench Transistor Cell", *1986 IEEE International Solid–State Circuits Conference, Digest of Technical Papers*, 268–269, (Feb. 21, 1986).

Sherony, M.J., et al., "Reduction of Threshold Voltage Sensitivity in SOI MOSFET's", *IEEE Electron Device Letters*, 16, 100–102, (Mar. 1995).

Shimomura, K., et al., "A 1V 46ns 16Mb SOI–DRAM with Body Control Technique", *1997 IEEE International Solid––State Circuits Conference, Digest of Technical Papers*, 68–69, (Feb. 6, 1997).

Stellwag, T.B., et al., "A Vertically–Integrated GaAs Bipolar DRAM Cell", *IEEE Transactions on Electron Devices*, 38, 2704–2705, (Dec. 1991).

Sunouchi, K., et al., "A Surrounding Gate Transistor (SGT) Cell for 64/256Mbit DRAMs", *1989 IEEE International Electron Devices Meeting, Technical Digest*, Washington, D.C., 23–26, (Dec. 3–6, 1989).

Sunouchi, K., et al., "Process Integration for 64M DRAM Using an Asymmetrical Stacked Trench Capacitor (AST) Cell", *1990 IEEE International Electron Devices Meeting*, San Francisco, CA, 647–650, (Dec. 9–12, 1990).

Takai, M., et al., "Direct Measurement and Improvement of Local Soft Error Susceptibility in Dynamic Random Access Memories", *Nuclear Instruments & Methods in Physics Research*, B–99, Proceedings of the 13th International Conference on the Application of Accelerators in Research and Industry, Denton, TX, 562–565, (Nov. 7–10, 1994).

Takato, H., et al., "High Performance CMOS Surrounding Gate Transistor (SGT) for Ultra High Density LSIs", *1988 IEEE International Electron Devices Meeting, Technical Digest*, 222–225, (1988).

Takato, H., et al., "Impact of Surrounding Gate Transistor (SGT) for Ultra–High Density LSI's", *IEEE Transactions on Electron Devices*, 38, 573–578, (Mar. 1991).

Tanabe, N., et al., "A Ferroelectric Capacitor Over Bit–Line (F–COB) Cell for High Density Nonvolatile Ferroelectric Memories", *1995 Symposium on VLSI Technology, Digest of Technical Papers*, Kyoto, Japan, 123–124, (Jun. 6–8, 1995).

Temmler, D., "Multilayer Vertical Stacked Capacitors (MVSTC) for 64Mbit and 256Mbit DRAMs", *1991 Symposium on VLSI Technology, Digest of Technical Papers*, Oiso, 13–14, (May 28–30, 1991).

Terauchi, M., et al., "A Surrounding Gate Transistor (SGT) Gain Cell for Ultra High Density DRAMs", *1993 Symposium on VLSI Technology, Digest of Technical Papers*, Kyoto, Japan, 21–22, (1993).

Tsui, P.G., et al., "A Versatile Half–Micron Complementary BiCMOS Technology for Microprocessor–Based Smart Power Applications", *IEEE Transactions on Electron Devices*, 42, 564–570, (Mar. 1995).

Verdonckt–Vandebroek, S., et al., "High–Gain Lateral Bipolar Action in a MOSFET Structure", *IEEE Transactions on Electron Devices*, 38, 2487–2496, (Nov. 1991).

Wang, N., *Digital MOS Integrated Circuits*, Prentice Hall, Inc., Englewood Cliffs, NJ, pp. 328–333, (1989).

Wang, P.W., et al., "Excellent Emission Characteristics of Tunneling Oxides Formed Using Ultrathin Silicon Films for Flash Memory Devices", *Japanese Journal of Applied Physics*, 35, 3369–3373, (Jun. 1996).

Watanabe, H., et al., "A New Cylindrical Capacitor Using Hemispherical Grained Si (HSG–Si) for 256Mb DRAMs", *IEEE International Electron Devices Meeting, Technical Digest*, San Francisco, CA, 259–262, (Dec. 13–16, 1992).

Watanabe, H., et al., "A Novel Stacked Capacitor with Porous–Si Electrodes for High Density DRAMs", *1993 Symposium on VLSI Technology, Digest of Technical Papers*, Kyoto, Japan, 17–18, (1993).

Watanabe, H., et al., "An Advanced Fabrication Technology of Hemispherical Grained (HSG) Poly–Si for High Capacitance Storage Electrodes", *Extended Abstracts of the 1991 International Conference on Solid State Devices and Materials*, Yokohama, Japan, 478–480, (1991).

Watanabe, H., et al., "Device Application and Structure Observation for Hemispherical–Grained Si", *J. Appl. Phys.*, 71, 3538–3543, (Apr. 1992).

Watanabe, H., et al., "Hemispherical Grained Silicon (HSG–Si) Formation on In–Situ Phosphorous Doped Amorphous–Si Using the Seeding Method", *Extended Abstracts of the 1992 International Conference on Solid State Devices and Materials*, Tsukuba, Japan, 422–424, (1992).

Yamada, T., et al., "A New Cell Structure with a Spread Source/Drain (SSD) MOSFET and a Cylindrical Capacitor for 64–Mb DRAM's", *IEEE Transactions on Electron Devices*, 38, 2481–2486, (Nov. 1991).

Yamada, T., et al., "Spread Source/Drain (SSD) MOSFET Using Selective Silicon Growth for 64Mbit DRAMs", *1989 IEEE International Electron Devices Meeting, Technical Digest*, Washington, D.C., 35–38, (Dec. 3–6, 1989).

Yoshikawa, K., "Impact of Cell Threshold Voltage Distribution in the Array of Flash Memories on Scaled and Multilevel Flash Cell Design", *1996 Symposium on VLSI Technology, Digest of Technical Papers*, Honolulu, HI, 240–241, (Jun. 11–13, 1996).

Adler, E., et al., "The Evolution of IBM CMOS DRAM Technology", *IBM Journal of Research and Development*, 39, 167–188 (Jan./Mar., 1995).

Kuge, S., et al., "SOI–DRAM Circuit Technologies for Low Power High Speed Multigiga Scale Memories ", *IEEE Journal of Solid–State Circuits*, 31, 586–591 (Apr. 1996).

Lu, N., et al., "The SPT Cell —A New Substrate–Plate Trench Cell for DRAMs", *1985 IEEE International Electron Devices Meeting, Technical Digest*, Washington, D.C., 771–772 (Dec. 1–4, 1985).

Rao, K.V., et al., "Trench Capacitor Design Issues in VLSI DRAM Cells", *1986 IEEE International Electron Devices Meeting, Technical Digest*, Los Angeles, CA, 140–143 (Dec. 7–10, 1986).

Suma, K., et al., "An SOI–DRAM with Wide Operating Voltage Range by CMOS/SIMOX Technology", *IEEE Journal of Solid–State Circuits*, 29, 1323–1329 (Nov. 1994).

Watanabe, S., et al., "A Novel Circuit Technology with Surrounding Gate Transistors (SGT's) for Ultra High Density DRAM's", *IEEE Journal of Solid–State Circuits*, 30, 960–971 (Sep. 1995).

CIRCUIT AND METHOD FOR A FOLDED BIT LINE MEMORY USING TRENCH PLATE CAPACITOR CELLS WITH BODY BIAS CONTACTS

TECHNICAL FIELD OF THE INVENTION

The present invention relates generally to the field of memory devices and, in particular, to a circuit and method for a folded bit line memory using trench capacitor cells with body bias contacts.

BACKGROUND OF THE INVENTION

Electronic systems typically store data during operation in a memory device. In recent years, the dynamic random access memory (DRAM) has become a popular data storage device for such systems. Basically, a DRAM is an integrated circuit that stores data in binary form (e.g., "1" or "0") in a large number of cells. The data is stored in a cell as a charge on a capacitor located within the cell. Typically, a high logic level is approximately equal to the power supply voltage and a low logic level is approximately equal to ground.

The cells of a conventional DRAM are arranged in an array so that individual cells can be addressed and accessed. The array can be thought of as rows and columns of cells. Each row includes a word line that interconnects cells on the row with a common control signal. Similarly, each column includes a bit line that is coupled to at most one cell in each row. Thus, the word and bit lines can be controlled so as to individually access each cell of the array.

A memory array is typically implemented as an integrated circuit on a semiconductor substrate in one of a number of conventional layouts. One such layout is referred to as an "folded digit line" architecture. In this architecture, sense amplifier circuits are provided at the edge of the array. The bit lines are paired in complementary pairs. Each complementary pair in the array feeds into a sense amplifier circuit. The sense amplifier circuit detects and amplifies differences in voltage on the complementary pair of bit lines as described in more detail below.

To read data out of a cell, the capacitor of a cell is accessed by selecting the word line associated with the cell. A complementary bit line that is paired with the bit line for the selected cell is equilibrated with the voltage on the bit line for the selected cell. The equilibration voltage is typically midway between the high and low logic levels. Thus, conventionally, the bit lines are equilibrated to one-half of the power supply voltage, $V_{cc}/2$. When the word line is activated for the selected cell, the capacitor of the selected cell discharges the stored voltage onto the bit line, thus changing the voltage on the bit line.

The sense amplifier detects and amplifies the difference in voltage on the pair of bit lines. The sense amplifier typically includes two main components: an n-sense amplifier and a p-sense amplifier. The n-sense amplifier includes a cross-coupled pair of n-channel transistors that drive the low bit line to ground. The p-sense amplifier includes a cross-coupled pair of p-channel transistors and is used to drive the high bit line to the power supply voltage.

An input/output device for the array, typically an n-channel transistor, passes the voltage on the bit line for the selected cell to an input/output line for communication to, for example, a processor of a computer or other electronic system associated with the DRAM. In a write operation, data is passed from the input/output lines to the bit lines by the input/output device of the array for storage on the capacitor in the selected cell.

Each of the components of a memory device are conventionally formed as part of an integrated circuit on a "chip" or wafer of semiconductor material. One of the limiting factors in increasing the capacity of a memory device is the amount of surface area of chip used to form each memory cell. In the industry terminology, the surface area required for a memory cell is characterized in terms of the minimum feature size, "F," that is obtainable by the lithography technology used to form the memory cell. Conventionally, the memory cell is laid out with a transistor that includes first and second source/drain regions separated by a body or gate region that are disposed horizontally along a surface of the chip. When isolation between adjacent transistors is considered, the surface area required for such a transistor is generally $8F^2$ or $6F^2$.

Some researchers have proposed using a vertical transistor in the memory cell in order to reduce the surface area of the chip required for the cell. Each of these proposed memory cells, although smaller in size from conventional cells, fails to provide adequate operational characteristics when compared to more conventional structures. For example, U.S. Pat. No. 4,673,962 (the '962 Patent) issued to Texas Instruments on Jun. 16, 1997. The '962 Patent discloses the use of a thin poly-silicon field effect transistor (FET) in a memory cell. The poly-silicon FET is formed along a sidewall of a trench which runs vertically into a substrate. At a minimum, the poly-silicon FET includes a junction between poly-silicon channel 58 and the bit line 20 as shown in FIG. 3 of the '962 Patent. Unfortunately, this junction is prone to charge leakage and thus the poly-silicon FET may have inadequate operational qualities to control the charge on the storage capacitor. Other known disadvantages of such thin film poly-silicon devices may also hamper the operation of the proposed cell.

Other researchers have proposed use of a "surrounding gate transistor" in which a gate or word line completely surrounds a vertical transistor. See, e.g., *Impact of a Vertical F-shape transistor (VFT) Celifor 1 Gbit DRAM and Beyond*, IEEE Trans. On Elec. Devices, Vol 42, No. 12, December, 1995, pp. 2117–2123. Unfortunately, these devices suffer from problems with access speed due to high gate capacitance caused by the increased surface area of the gate which slows down the rise time of the word lines. Other vertical transistor cells include a contact between the pass transistor and a poly-silicon plate in the trench. Such vertical transistor cells are difficult to implement due to the contact and should produce a low yield.

For the reasons stated above, and for other reasons stated below which will become apparent to those skilled in the art upon reading and understanding the present specification, there is a need in the art for realizable memory cell that uses less surface area than conventional memory cells.

SUMMARY OF THE INVENTION

The above mentioned problems with memory cells and other problems are addressed by the present invention and which will be understood by reading and studying the following specification. A memory cell for a folded bit line configuration is described which includes a vertical transistor with a body contact and a source/drain region that acts as a plate of a trench capacitor.

In particular, in one embodiment a memory cell for a memory array in a folded bit line configuration is provided. The memory cell includes an access transistor formed in a pillar of single crystal semiconductor material. The access transistor has first and second source/drain regions and a body region that are vertically aligned. A body contact is coupled to the body region of the access transistor that provides a body bias to the access transistor. The access transistor further includes a gate coupled to a word line disposed adjacent to the body region. A passing word line is separated from the gate by an insulator for coupling to other memory cells adjacent to the memory cell. A trench capacitor is also included. The trench capacitor includes a first plate that is formed integral with the first source/drain region of the access transistor and a second plate that is disposed adjacent to the first plate and separated from the first plate by a gate oxide.

In another embodiment, a memory device is provided. The memory device includes an array of memory cells. Each memory cell includes a vertical access transistor formed of a single crystalline semiconductor pillar that extends outwardly from a substrate with body and first and second source/drain regions, a gate disposed adjacent to a side of the pillar adjacent to the body region and a trench capacitor. A first plate of the trench capacitor is integral with the first source/drain region and a second plate of the trench capacitor is disposed adjacent to the first plate. A number of bit lines are each selectively coupled to a number of the memory cells at the second source/drain region of the access transistor so as to form columns of memory cells in a folded bit line configuration. A number of word lines are disposed substantially orthogonal to the bit lines in trenches between rows of the memory cells. Each trench includes two word lines and each word line is coupled to gates of alternate access transistors on opposite sides of the trench. A number of body contacts are disposed between adjacent access transistors in a row of memory cells.

In one embodiment, a memory array is provided. The memory array includes a number of memory cells that form an array with a number of rows and columns. Each memory cell includes an access transistor with body and first and second source/drain regions formed vertically, outwardly from a substrate and a gate disposed adjacent to a side of the transistor. The second source/drain region includes an upper semiconductor surface. A number of first isolation trenches separate adjacent rows of memory cells. First and second word lines are disposed in each of the first isolation trenches and coupled to alternate gates on opposite sides of the trench. A number of second isolation trenches, each substantially orthogonal to the first isolation trenches, are interposed between adjacent memory cells. Further, a number of body contacts are disposed in the second isolation trenches that interconnect body regions of adjacent access transistors.

In another embodiment, a method of fabricating a memory array is provided. The method includes forming a number of access transistors. Each access transistor is formed in a pillar of semiconductor material that extends outwardly from a substrate. The access transistor includes a first source/drain region, a body region and a second source/drain region formed vertically thereupon. The method further includes forming a trench capacitor. A first plate of the trench capacitor is integral with the first source/drain region of the access transistor. The method further includes forming a number of word lines in a number of trenches that separate adjacent rows of access transistors. Each trench includes two word lines with a gate of each word line interconnecting alternate access transistors on opposite sides of the trench. A number of bit lines that interconnect second source/drain regions of selected access transistors are also formed. The method also forms a number of body contacts that interconnect body regions of adjacent access transistors.

DETAILED DESCRIPTION OF THE INVENTION

In the following detailed description of the invention, reference is made to the accompanying drawings which form a part hereof, and in which is shown, by way of illustration, specific embodiments in which the invention may be practiced. The embodiments are intended to describe aspects of the invention in sufficient detail to enable those skilled in the art to practice the invention. Other embodiments may be utilized and logical, mechanical and electrical changes may be made without departing from the scope of the present invention. The following detailed description is, therefore, not to be taken in a limiting sense.

In the following description, the terms wafer and substrate are interchangeably used to refer generally to any structure on which integrated circuits are formed, and also to such structures during various stages of integrated circuit fabrication. Both terms include doped and undoped semiconductors, epitaxial layers of a semiconductor on a supporting semiconductor or insulating material, combinations of such layers, as well as other such structures that are known in the art.

The term "horizontal" as used in this application is defined as a plane parallel to the conventional plane or surface of a wafer or substrate, regardless of the orientation of the wafer or substrate. The term "vertical" refers to a direction perpendicular to the horizonal as defined above. Prepositions, such as "on," "side" (as in "sidewall"), "higher," "lower," "over" and "under" are defined with respect to the conventional plane or surface being on the top surface of the wafer or substrate, regardless of the orientation of the wafer or substrate.

Figure 1:
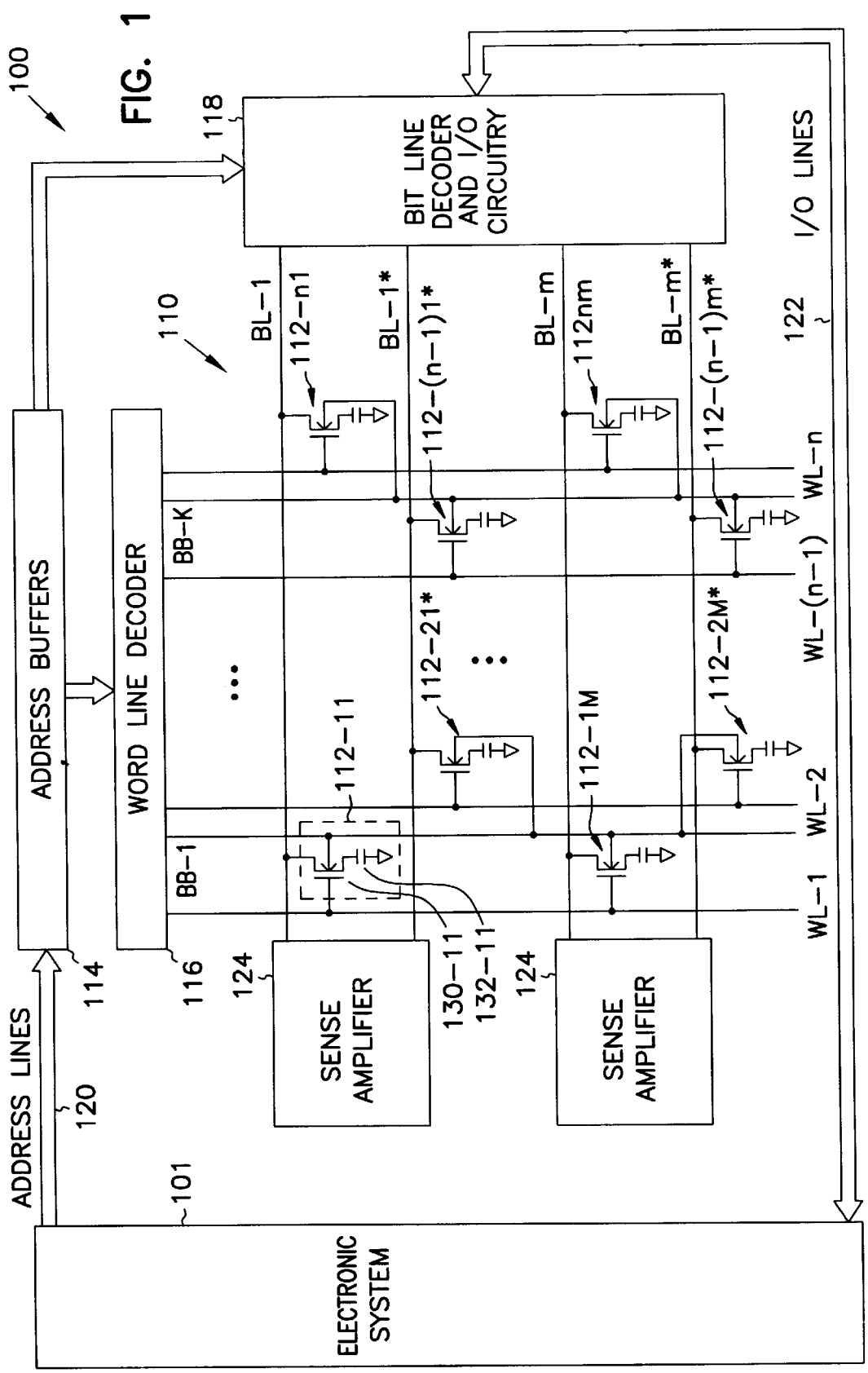
FIG. 1 is a block/schematic diagram of an illustrative embodiment of the present invention that includes a memory device that is coupled to an electronic system.

FIG. 1 is a block/schematic diagram that illustrates generally one embodiment of a memory device 100 incorporating an array of memory cells constructed according to the teachings of the present invention. Memory device 100 is coupled to electronic system 101. Electronic system 101 may comprise, for example, a microprocessor, a memory controller, a chip set or other appropriate electronic system. Memory device 100 illustrates, by way of example but not by way of limitation, a dynamic random access memory (DRAM), in a folded bit line configuration. Memory device 100 includes array 110 with N word lines and M complementary bit line pairs. Array 110 further includes memory cells 112-ij, where i refers to the word line of the cell and j refers to the bit line of the cell. It is noted that an asterisk (*) is used to indicate a cell that is associated with a complementary bit line.

In the exemplary embodiment of FIG. 1, each of memory cells 112-ij has a substantially identical structure, and accordingly, only one memory cell is described herein. These memory cells 112-ij include a vertical transistor where one plate of a capacitor is integral with the transistor.

The vertical transistors are laid out in a substantially checker-board pattern of rows and columns on a substrate. Memory cell 112-11 includes vertical transistor 130-11. A source/drain region of transistor 130-11 is formed in a deep trench and extends to a sufficient depth to form a storage node of storage capacitor 132-11. The other terminal of storage capacitor 132-11 is part of a mesh or grid of poly-silicon that surrounds the source/drain region of transistor 130-11 and is coupled to ground potential.

The N word lines, WL-1 through WL-N, are formed in trenches that separate adjacent rows of vertical transistors 130-ij. Each trench houses up to two word lines, with each word line in a trench acting as a gate for alternate transistors on one side of the trench.

Bit lines BL-1 through BL-M are used to write to and read data from memory cells 112-ij in response to addressing circuitry. For example, address buffer 114 is coupled to control bit line decoder 118, which also includes sense amplifiers and input/output circuitry that is coupled to bit lines BL-l through BL-M and complement bit lines BL-1* through BL-M* of array 110. Address buffer 114 also is coupled to control word line decoder 116. Word line decoder 116 and bit line decoder 118 selectably access memory cells 112-ij in response to address signals that are provided on address lines 120 from electronic system 101 during write and read operations.

Memory 100 also includes body bias lines BB-1 through BB-K. As illustrated, the body bias lines are coupled to word line decoder 116 so as to selectively control the potential applied to the body of the vertical transistors. In an alternative embodiment, the body bias lines can be coupled to the common plate (e.g., the mesh or grid) of the storage capacitors in each cell. In these embodiments, the body is driven with either a fixed or a synchronous body bias depending on the architecture used in the array. The body can be driven with a fixed bias by connection to the poly-silicon plate of the s storage capacitors. Alternatively, the bodies can be driven by a continuous line that connects the bodies of adjacent transistors to form the body bias line. These body bias lines can be driven at different potentials. When a synchronous body address technique is used, the body is driven slightly positive when the cell is addressed and slightly negative when not addressed. Advantageously, this provides more overdrive when the cell is addressed and less leakage when the cell is in standby. The bodies can also just be driven at some fixed body bias potential around negative one half volt so that the threshold voltage of the transistors is positive. This reduces the requirements on threshold voltage control of the access transistor. Any threshold voltage without body bias around zero volts is sufficient.

In operation, memory 100 receives an address of a particular memory cell at address buffer 114. For example, electronic system 101 may provide address buffer 114 with the address for cell 112-11 of array 110. Address buffer 114 identifies word line WL-1 for memory cell 112-11 to word line decoder 116. Word line decoder 116 selectively activates word line WL-1 to activate access transistor 130-1j of each memory cell 112-1j that is connected to word line WL-1. Bit line decoder 118 selects bit line BL-1 for memory cell 112-11. For a write operation, data received by input/output circuitry is coupled to bit lines BL-1 through access transistor 130-11 to charge or discharge storage capacitor 132-11 of memory cell 112-11 to represent binary data. For a read operation, bit line BL-1 of array 110 is equilibrated with bit line BL-1*. Data stored in memory cell 112-11, as represented by the charge on its storage capacitor 132-11, is coupled to bit line BL-1 of array 110. The difference in charge in bit line BL-1 and bit line BL-1* is amplified, and a corresponding voltage level is provided to the input/output circuits. Body bias lines BB-1 through BB-K are driven to a selected potential to implement either fixed or synchronous body bias during read and write operations.

Figure 2:
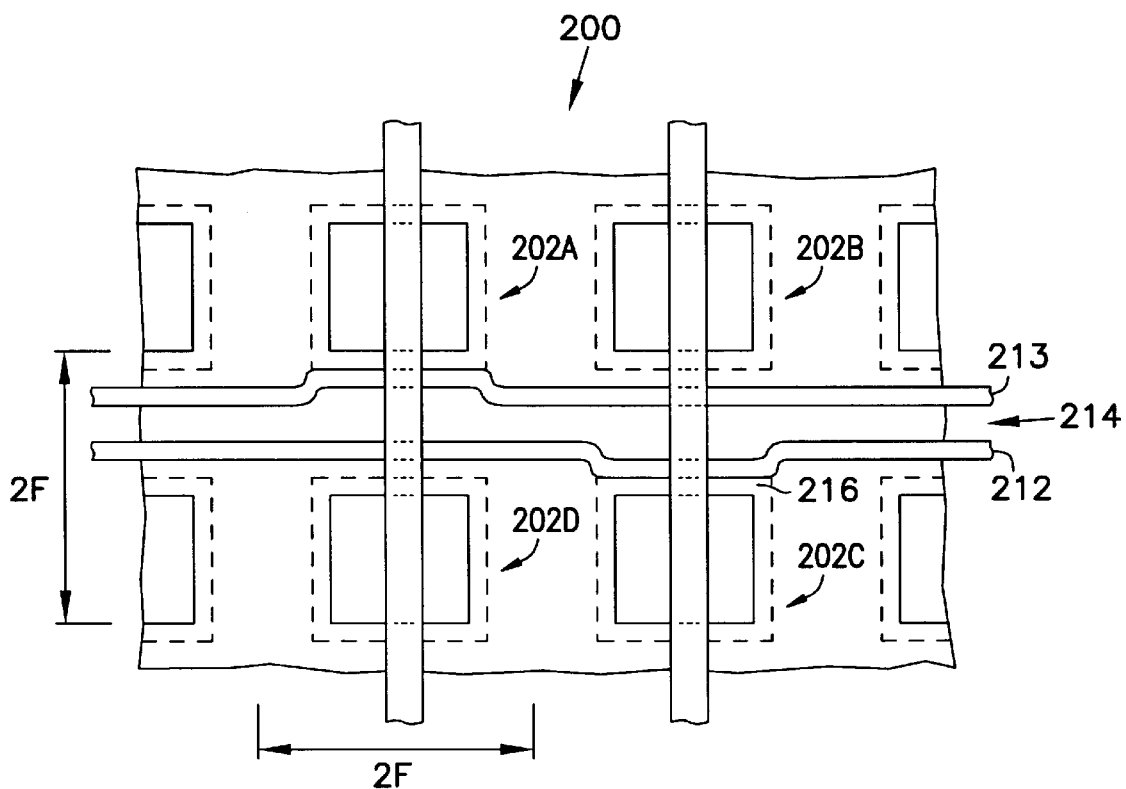
FIG. 2 is a plan view of an illustrative embodiment of a layout for a portion of a memory array according to the teachings of the present invention.
Figure 3:
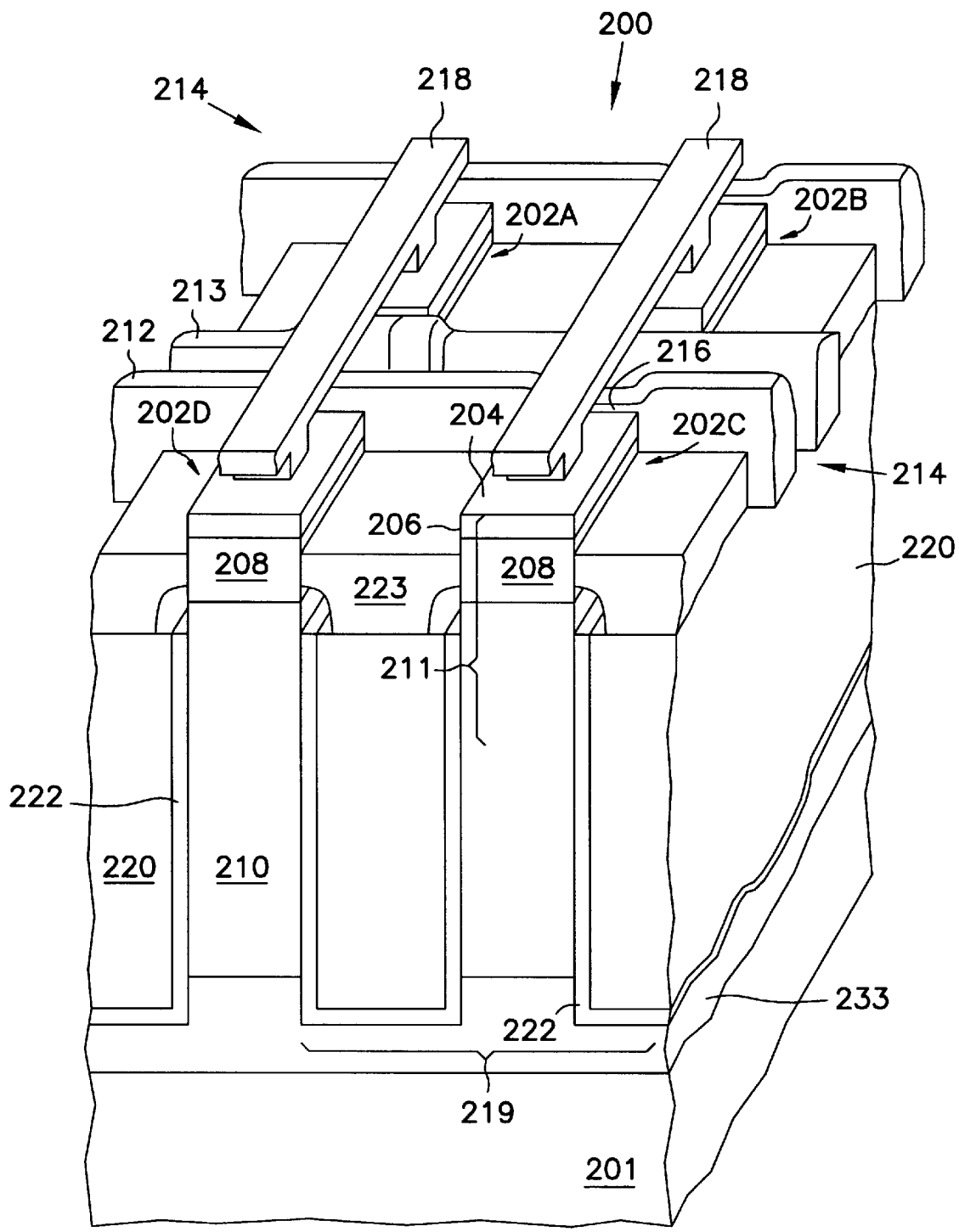
FIG. 3 is a perspective view of an illustrative embodiment of a memory array according to the teachings of the present invention.

FIGS. 2, 3, and illustrate embodiments of a memory cell with a vertical transistor and trench capacitor for use, for example, in memory device 100 of FIG. 1. Specifically, FIG. 2 is a plan view of a layout of a number of memory cells indicated generally at 202A through 202D in array 200. FIG. 2 depicts only four memory cells. It is understood, however, that array 200 may include a larger number of memory cells even though only four are depicted here.

Each memory cell is constructed in a similar manner. Thus, only memory cell 202C is described herein in detail. Memory cell 202C includes pillar 204 of single crystal semiconductor material, e.g., silicon, that is divided into first source/drain region 206, body region 208, and second source/drain region 210 to form access transistor 211. Pillar 204 extends vertically outward from substrate 201 of, for example, p– silicon. First source/drain region 206 and second source/drain region 210 each comprise, for example, n+ silicon and body region 208 comprises p– silicon.

Word line 212 passes body region 208 of access transistor 211 in isolation trench 214. Word line 212 is separated from body region 208 of access transistor 211 by gate oxide 216 such that the portion of word line 212 adjacent to body region 208 operates as a gate for access transistor 211. Word line 212 may comprise, for example, n+ poly-silicon material that is deposited in isolation trench 214 using an edge-defined technique such that word line 212 is less than a minimum feature size, F, for the lithographic technique used to fabricate array 200. Passing word line 213 is also formed in trench 214. Cell 202C is coupled with cell 202B by bit line 218.

Memory cell 202C also includes storage capacitor 219 for storing data in the cell. A first plate of capacitor 219 for memory cell 202C is integral with second source/drain region 210 of access transistor 211. Thus, memory cell 202C may be more easily realizable when compared to conventional vertical transistors since there is no need for a contact between second source/drain region 210 and capacitor 219. Second plate 220 of capacitor 219 is common to all of the capacitors of array 200. Second plate 220 comprises a mesh or grid of n+ poly-silicon formed in deep trenches that surrounds at least a portion of second source/drain region 210 of each pillar of single crystal silicon. Second plate 220 is separated from source/drain region 210 by gate oxide 222. The entire structure of array 200 is separated from substrate 201 by oxide layer 233. In the embodiment shown here, the body regions of adjacent vertical transistors are coupled together by body contacts 223. In this embodiment, the body contacts are also coupled to the common second plate 220.

Figure 4:
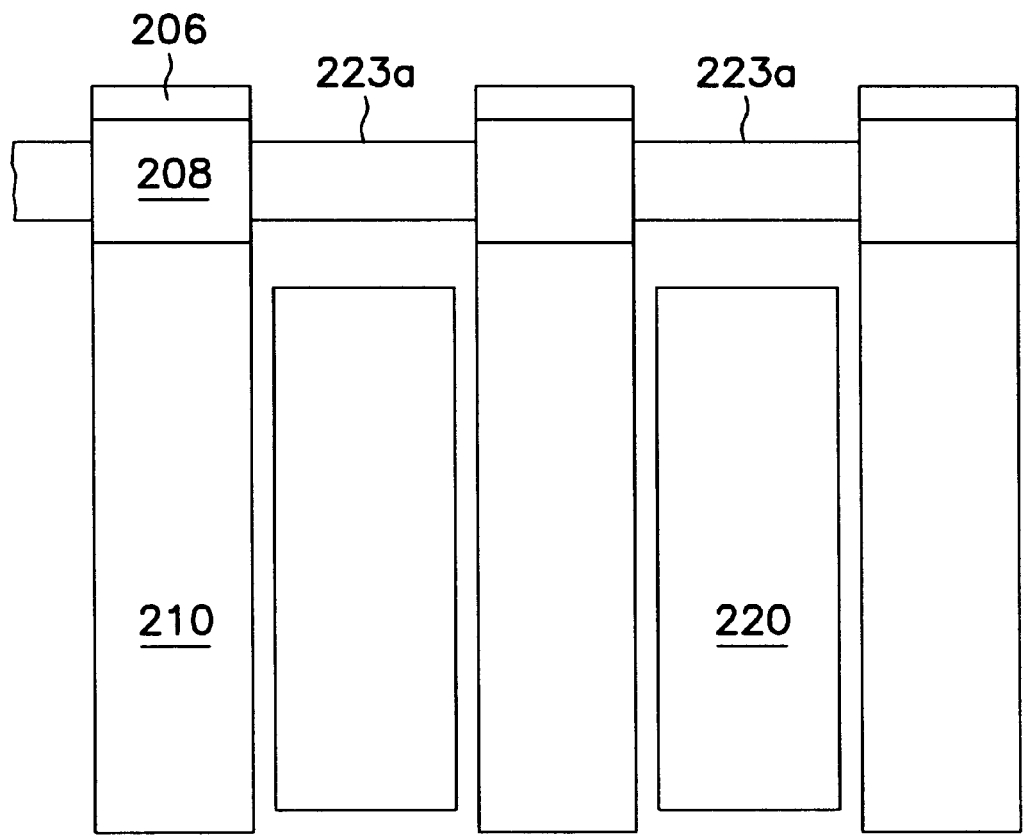
FIG. 4 is an elevational view of another illustrative embodiment of a body contact for transistors in a memory array according to the teachings of the present invention.

FIG. 4 is an elevational view that illustrates an alternative embodiment for the body contacts between adjacent vertical transistors in a memory array according to the teachings of the present invention. In this embodiment, body contacts 223a do not contact second plate 220. Rather, body contacts 223a are coupled between adjacent body regions so as to form a body bias line that can be coupled to a decoder circuit so that synchronous body bias voltages may be applied to the body regions. It is noted that in this embodiment, the body regions have significant resistance such that the body bias lines cannot extend over very many cells, e.g., 10 cells. After ten cells, a metal contact can be used to reduce the resistance in the body address line. This results in a slightly higher area associated with each cell but is consistent with a "hierarchical address" scheme in which the array is addressed in smaller blocks by, if necessary, using additional transfer devices and address decoding to pick out smaller blocks in the array. Thus, the embodiment of FIG. 4 provides a viable alternative.

As shown in FIG. 2, the memory cells of array 200 are four-square feature ($4F^2$) memory cells. Using cell 202D as an example, the surface area of cell 202D is calculated based on linear dimensions in the bit line and word line directions. In the bit line direction, the distance from one edge of cell 202D to a common edge of adjacent cell 202A is approximately 2 minimum feature sizes (2F). In the word line direction, the dimension is taken from the midpoint of isolation trenches on either side of memory cell 202D. Again, this is approximately two minimum feature sizes (2F). Thus, the size of the cell is $4F^2$. This size is much smaller than the current cells with stacked capacitors or trench capacitors.

Figure 5A:
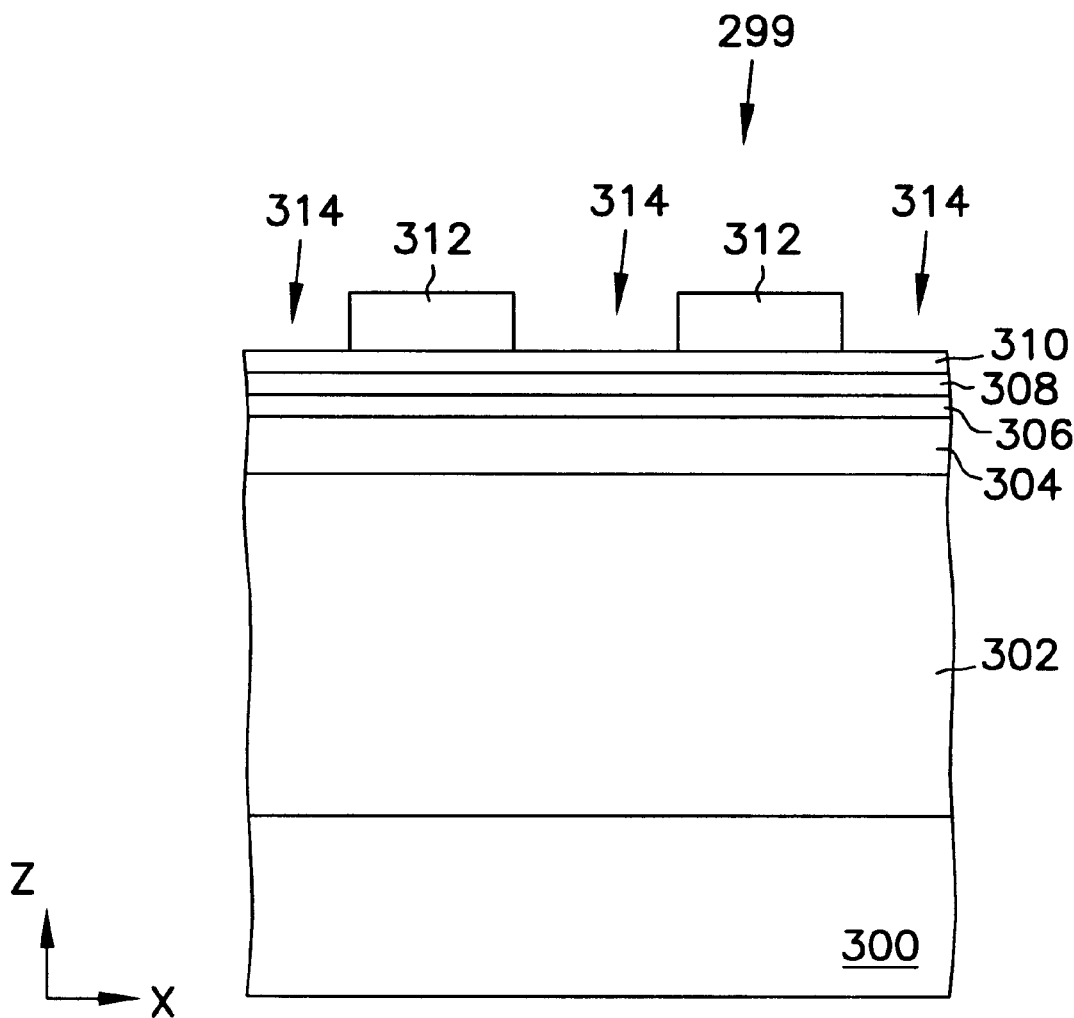
FIGS. 5A through 5P are perspective and elevational views of an embodiment of an integrated circuit that illustrate processing steps for fabricating the integrated circuit according to the teachings of the present invention.

FIGS. 5A through 5O illustrate one embodiment of a process for fabricating an array of memory cells, indicated generally at 299, according to the teachings of the present invention. In this example, dimensions are given that are appropriate to a 0.2 micrometer lithographic image size. For other image sizes, the vertical and horizontal dimensions can be scaled accordingly.

As shown in FIG. 5A, the method begins with substrate 300. Substrate 300 comprises, for example, a P-type silicon wafer, layer of P– silicon material, or other appropriate substrate material. Layer 302 is formed, for example, by epitaxial growth outwardly from layer 300. Layer 302 comprises single crystalline N+ silicon that is approximately 3.5 micrometers thick. Layer 304 is formed outwardly from layer 302 by epitaxial growth of single crystalline P– silicon of approximately 0.5 microns. Layer 306 is formed by ion implantation of donor dopant into layer 304 such that layer 306 comprises single crystalline N+ silicon with a depth of approximately 0.1 microns.

A thin layer of silicon dioxide ($SiO_2$), referred to as pad oxide 308, is deposited or grown on layer 306. Pad oxide 308 has a thickness of approximately 10 nanometers. A layer of silicon nitride ($Si_3N_4$), referred to as pad nitride 310, is deposited on pad oxide 308. Pad nitride 310 has a thickness of approximately 200 nanometers.

Figure 5B:
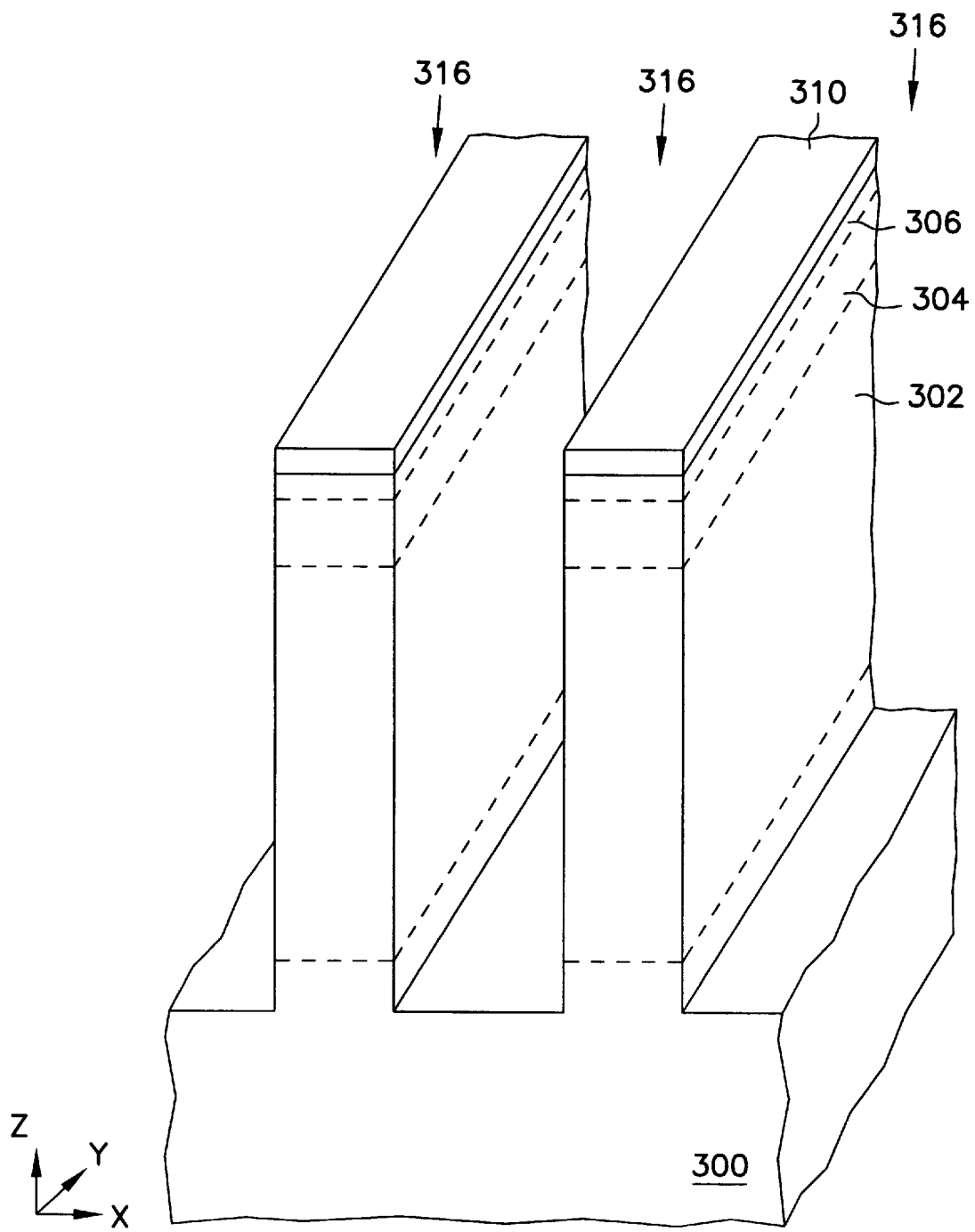

Photo resist layer 312 is deposited outwardly from layer 310. Photo resist layer 312 is patterned with a mask to define openings 314 in layer 312 to be used in selective etching. As shown in FIG. 5B, column isolation trenches 316 are etched through openings 314 in photo resist layer 312 in a direction parallel to which the bit lines will be formed. Column isolation trenches 316 extend down through nitride layer 310, oxide layer 308, N+ layer 306, P– layer 304, N+ layer 302, and into substrate 300.

A thin thermal protective oxide layer 318 is grown to a thickness of approximately 10 nanometers on exposed surfaces of substrate 300 and layers 302, 304, and 306. Layer 318 is used to protect substrate 300 and layers 302, 304 and 306 during s subsequent process step.

Figure 5C:
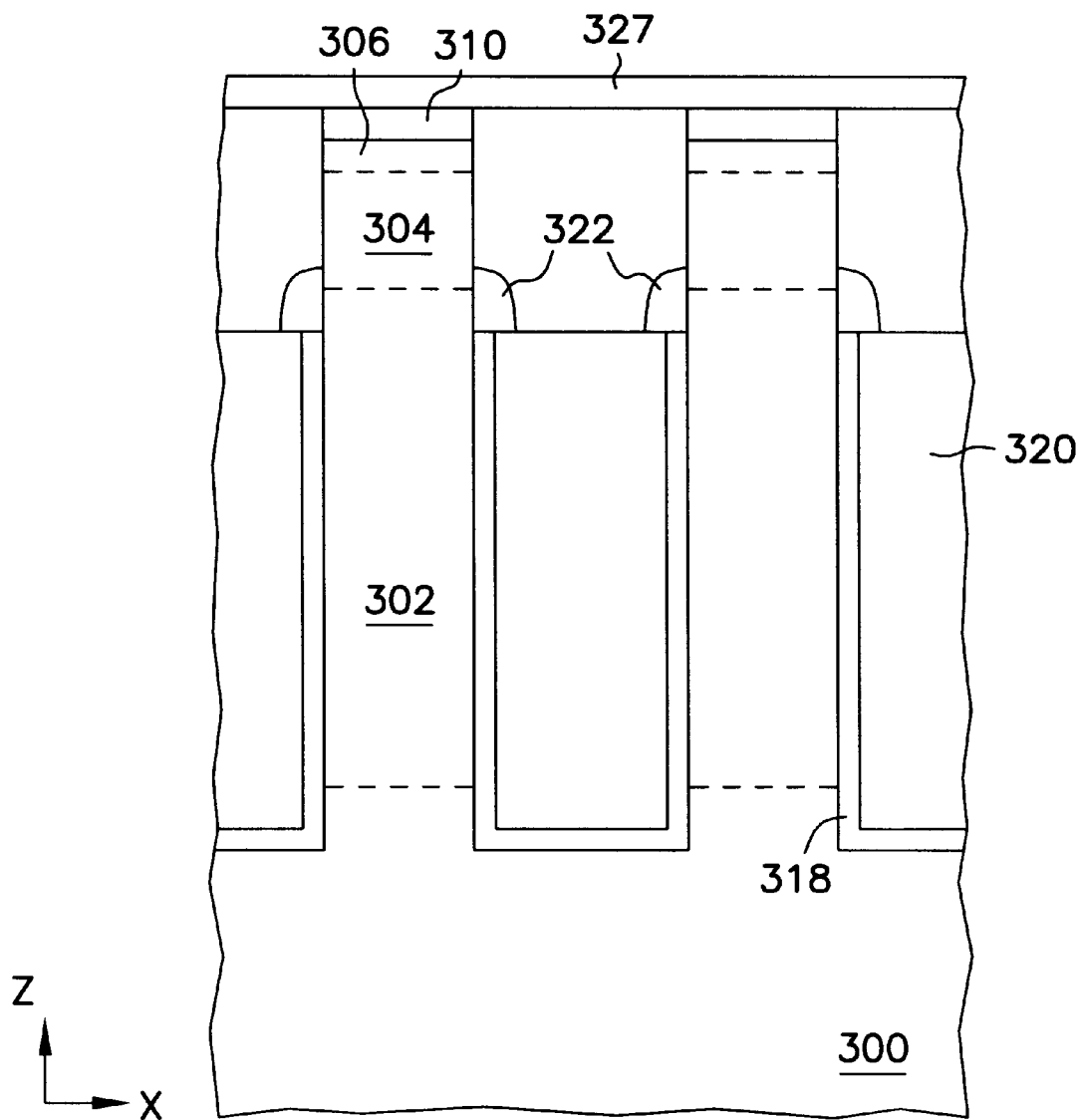

A layer of intrinsic poly-silicon 320 is deposited by chemical vapor deposition (CVD) to fill column isolation trenches 316. Layer 320 is etched by reactive ion etching (RIE) such that layer 320 is recessed just below a top of layer 302. An oxide layer is deposited by, for example, chemical vapor deposition to a thickness of approximately 60 nanometers in trenches 316. The oxide layer is directionally etched to form spacers 322 as shown in FIG. 5C.

Figure 5D:
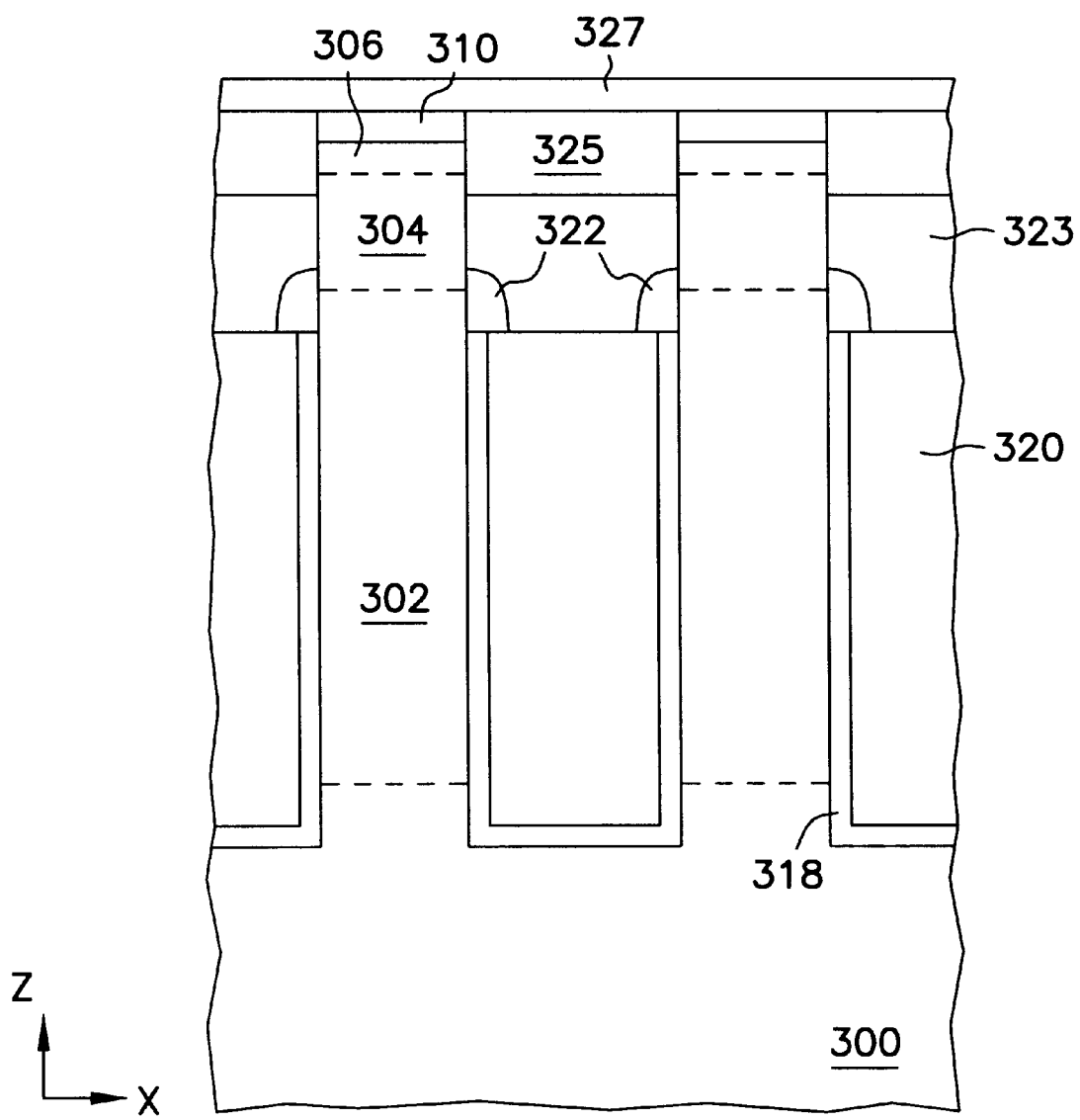

A layer of p+ poly-silicon is formed in trenches 316 by, for example, chemical vapor deposition. The layer of p+ poly-silicon is planarized and etched back to below the junction of layers 304 and 306 to form body contacts 323. Oxide layer 325 is formed by, for example, chemical vapor deposition to fill trenches 316. Oxide layer 325 is planarized by, for example, chemical/mechanical polishing to bring a working surface of layer 325 co-planar with a working surface of layer 310. Nitride mask layer 327 is formed by chemical vapor deposition to a thickness of approximately 100 nanometers to leave the structure shown in FIG. 5D.

Figure 5E:
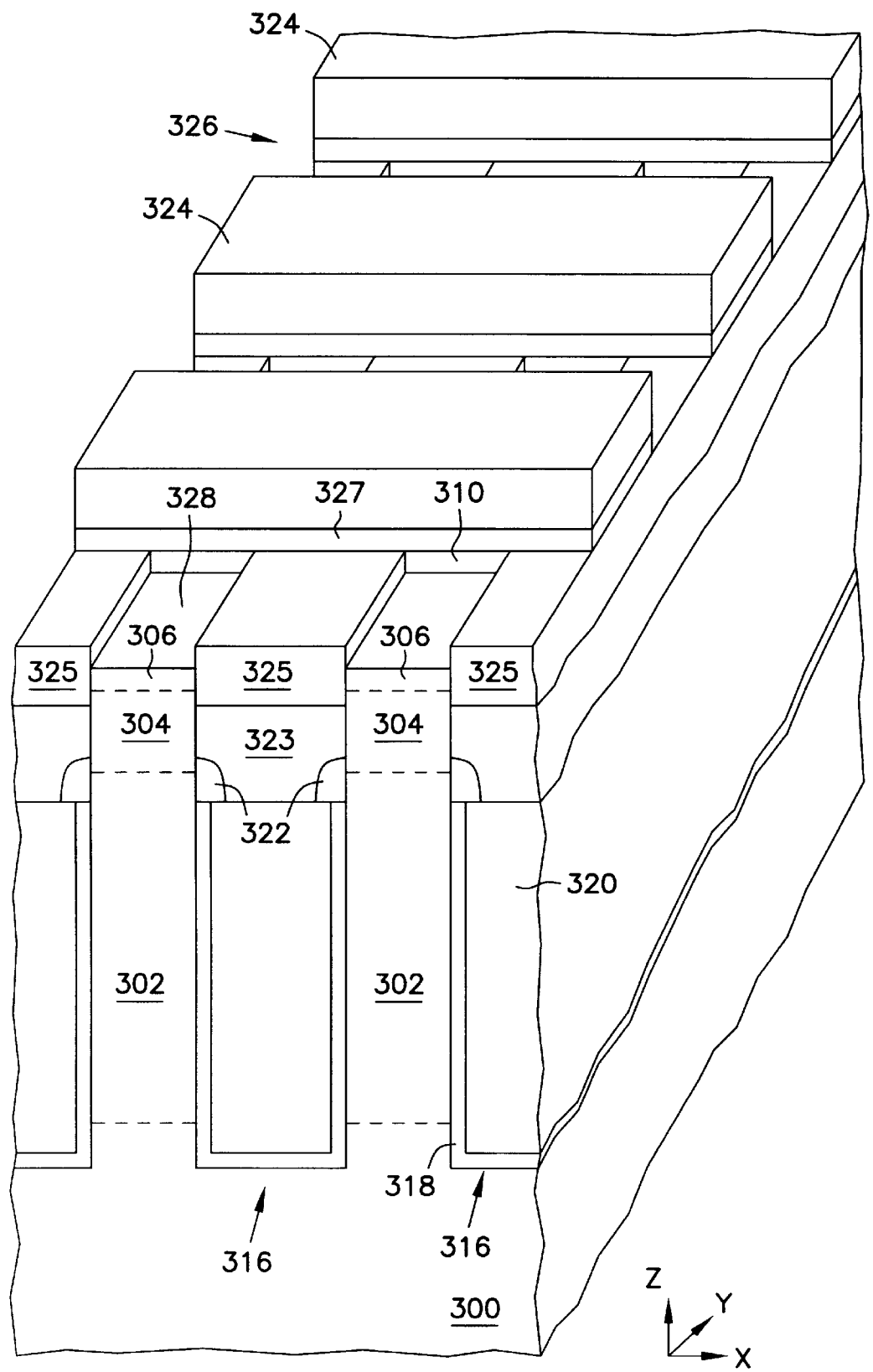

As shown in FIG. 5E, layer 324 of photo resist material is deposited outwardly from nitride mask layer 327. Layer 324 is exposed through a mask to define openings 326 in layer 324. Openings 326 are orthogonal to trenches 316 that were filled by intrinsic poly-silicon layer 320, spacers 322, body contacts 323, and oxide layer 325. Next, nitride mask layer 327 and pad nitride layer 310 are etched to a depth sufficient to expose working surface 328 of single crystal silicon layer 306. It is noted that at this point layer 320, spacers 322, and body contacts 323 are still covered by oxide layer 325.

Figure 5F:
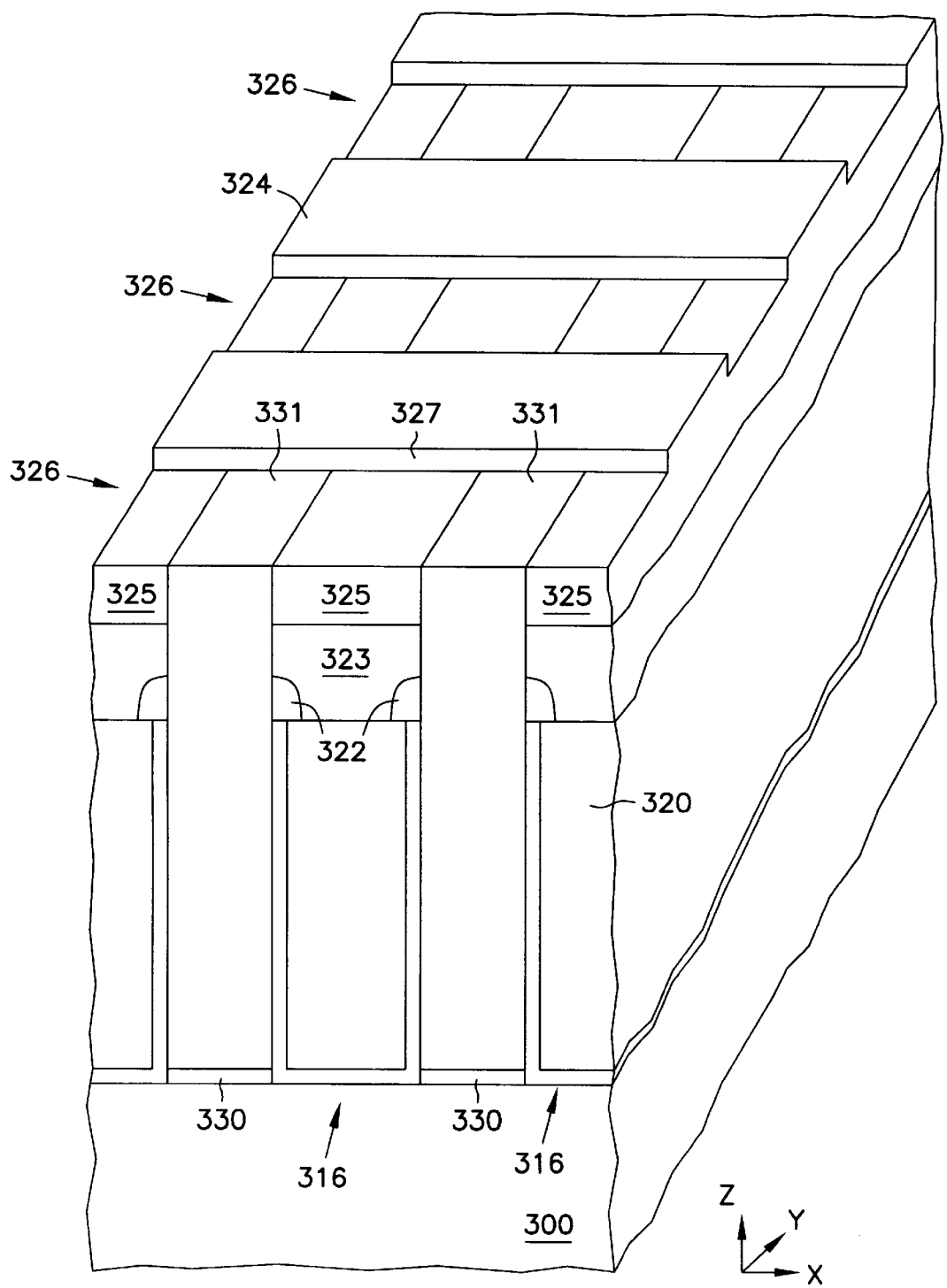

As shown in FIG. 5F, the portion of layers 306, 304, and 302 that are exposed in openings 326 are selectively etched down to a distance approximately equal to column isolation trenches 316. Layer 324 is removed and a thin thermal protective oxide 330 is grown on the exposed silicon of layers 302, 304 and 306 as well as an exposed upper surface of layer 300. Layer 331 of intrinsic poly-silicon is formed by, for example, chemical vapor deposition to refill the trenches left by the etch of layers 302, 304, and 306 in openings 326. Layer 331 is directionally etched with an etchant that is selective to nitride, e.g., the etchant will not attack nitride, until layer 325 (oxide) is exposed in openings 326. This leaves the structure shown in FIG. 5F.

Figure 5G:
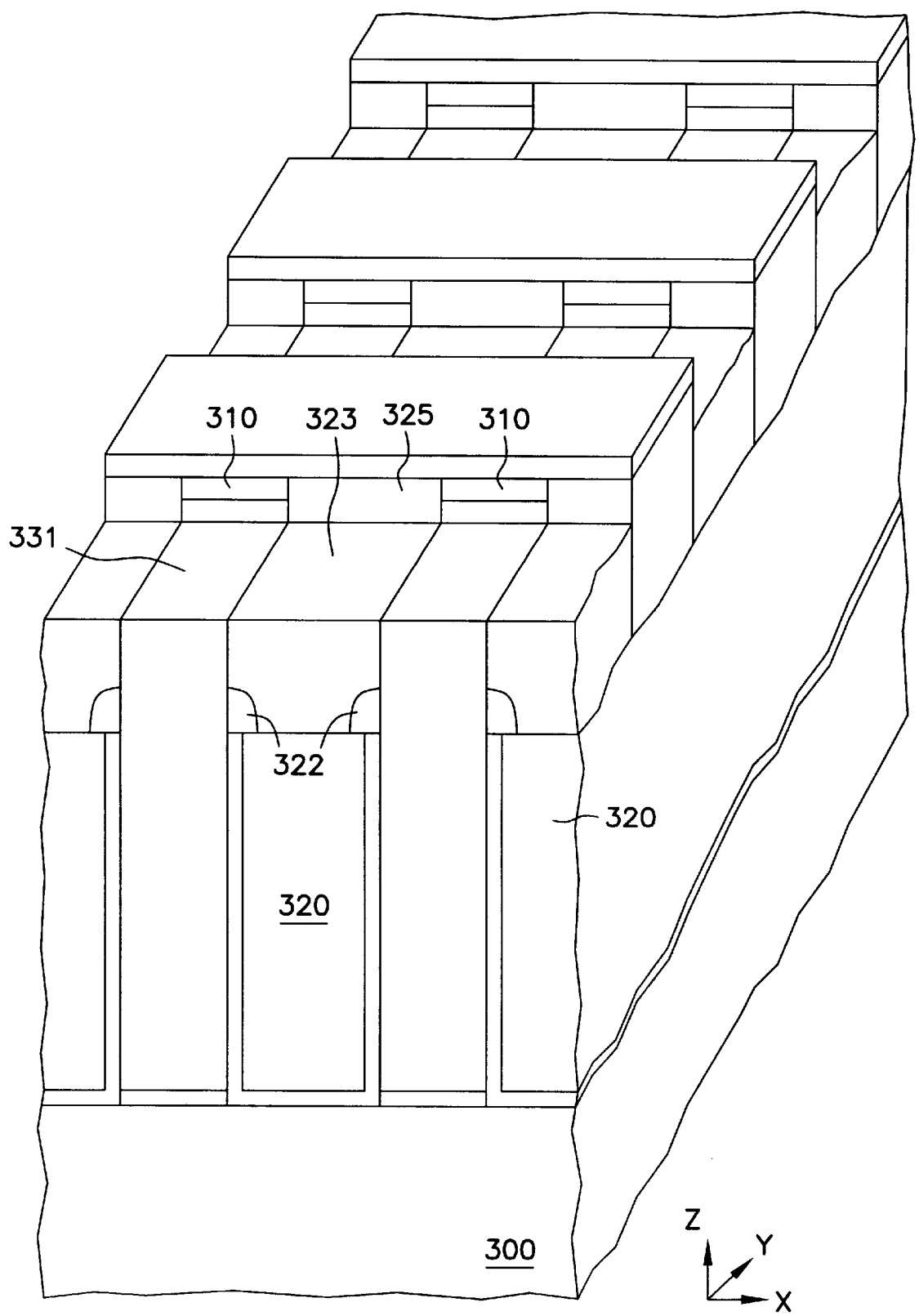
Figure 5H:
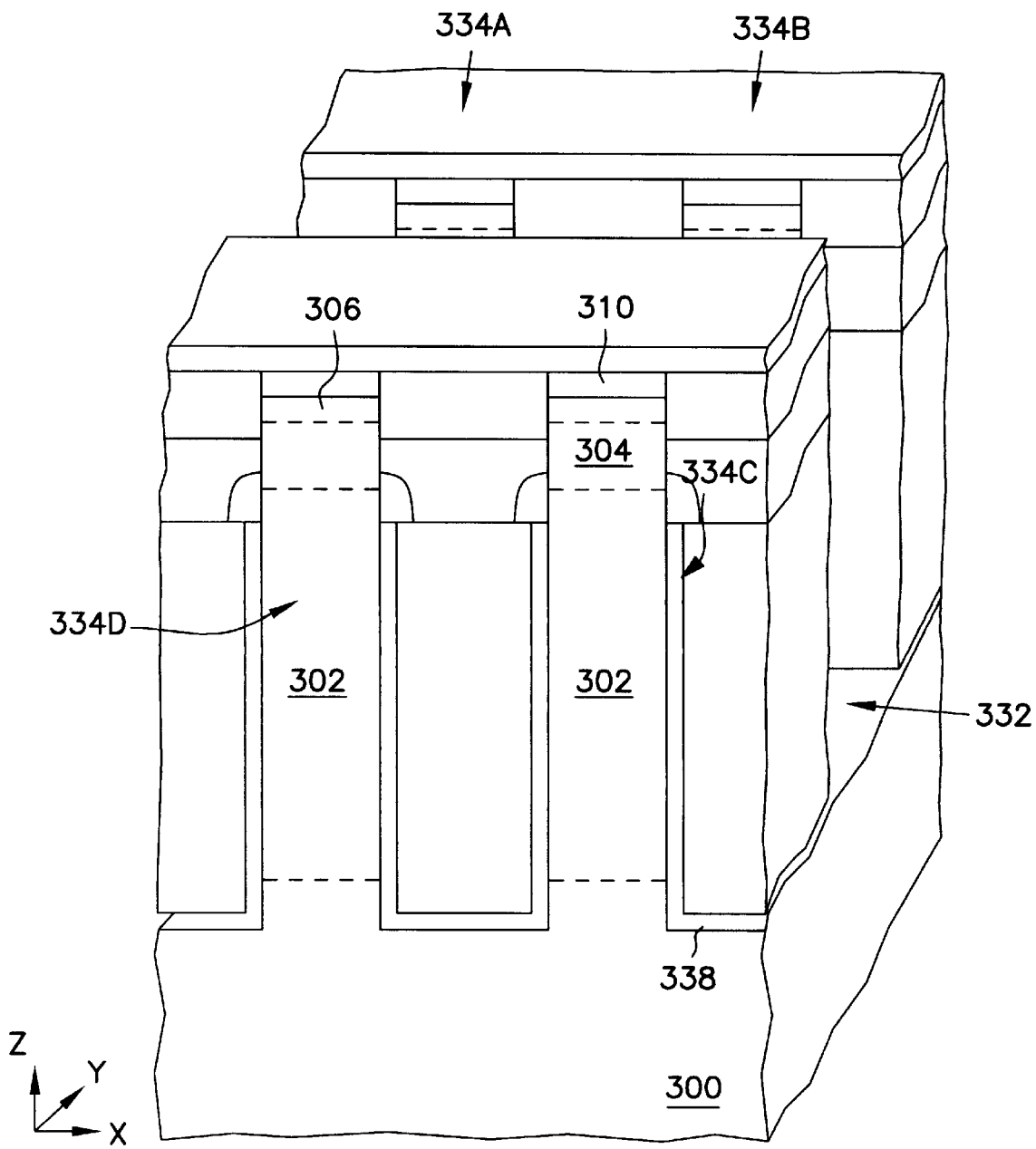

Layer 325 exposed in openings 326 is selectively, directionally etched to expose body contacts 323 (p+ poly-silicon) leaving the structure shown in FIG. 5G. Next, an anisotropic etchant is used to etch down through body contacts 323 as well as poly-silicon layers 331 and 320. During this process, spacers 322 are also removed. This leaves the structure with trenches 332 and single crystal silicon pillars 334A through 334D as shown in FIG. 5H.

Nitride is deposited by chemical vapor deposition in trenches 332 to a thickness of approximately 20 nanometers. The nitride is directionally etched to leave on the vertical sidewalls of trenches 332. Next, an isotropic oxide etch is used to remove all exposed thin oxide, clearing oxide from the bottom of trenches 332.

Figure 5I:
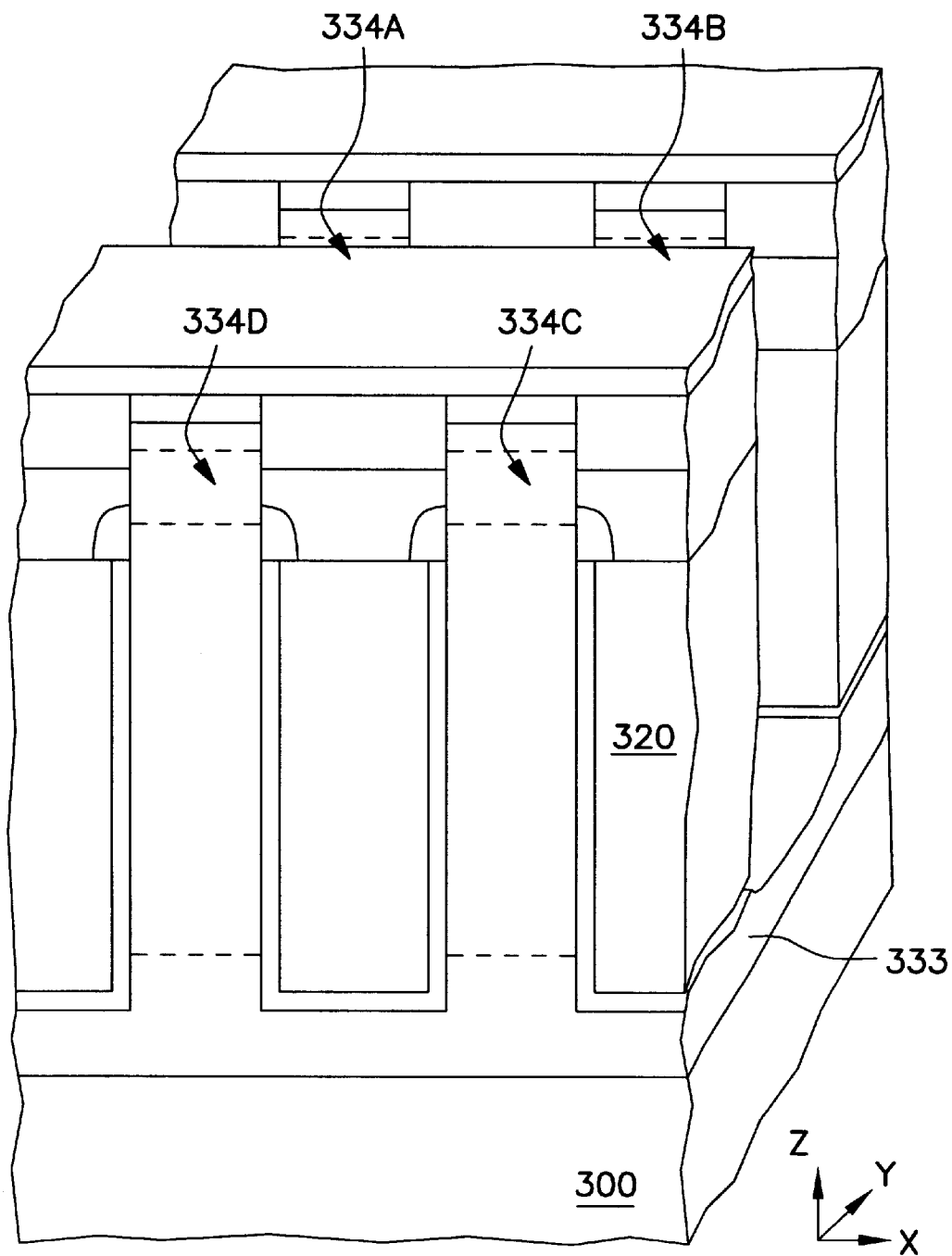

Thermal oxide layer 333 is formed beneath single crystal silicon pillars 334A through 334D. This is accomplished by an isotropic silicon etch that etches both single crystal and intrinsic poly-silicon downward and laterally to completely undercut pillars 334A through 334D. Although completely undercut, pillars 334A through 334D are supported by contact with original crystal at the ends. Next, thermal oxide layer 333 is grown with a thickness of approximately 0.1 micrometers (for 0.2 micrometer CD) beneath pillars 334A through 334D. The nitride is removed from the sidewalls of trenches 332 to expose the remaining intrinsic poly-silicon of layer 320. It is noted that pillars 334A through 334D are still covered with protective oxide 330. At this point the structure is as shown in FIG. 5I.

Figure 5J:
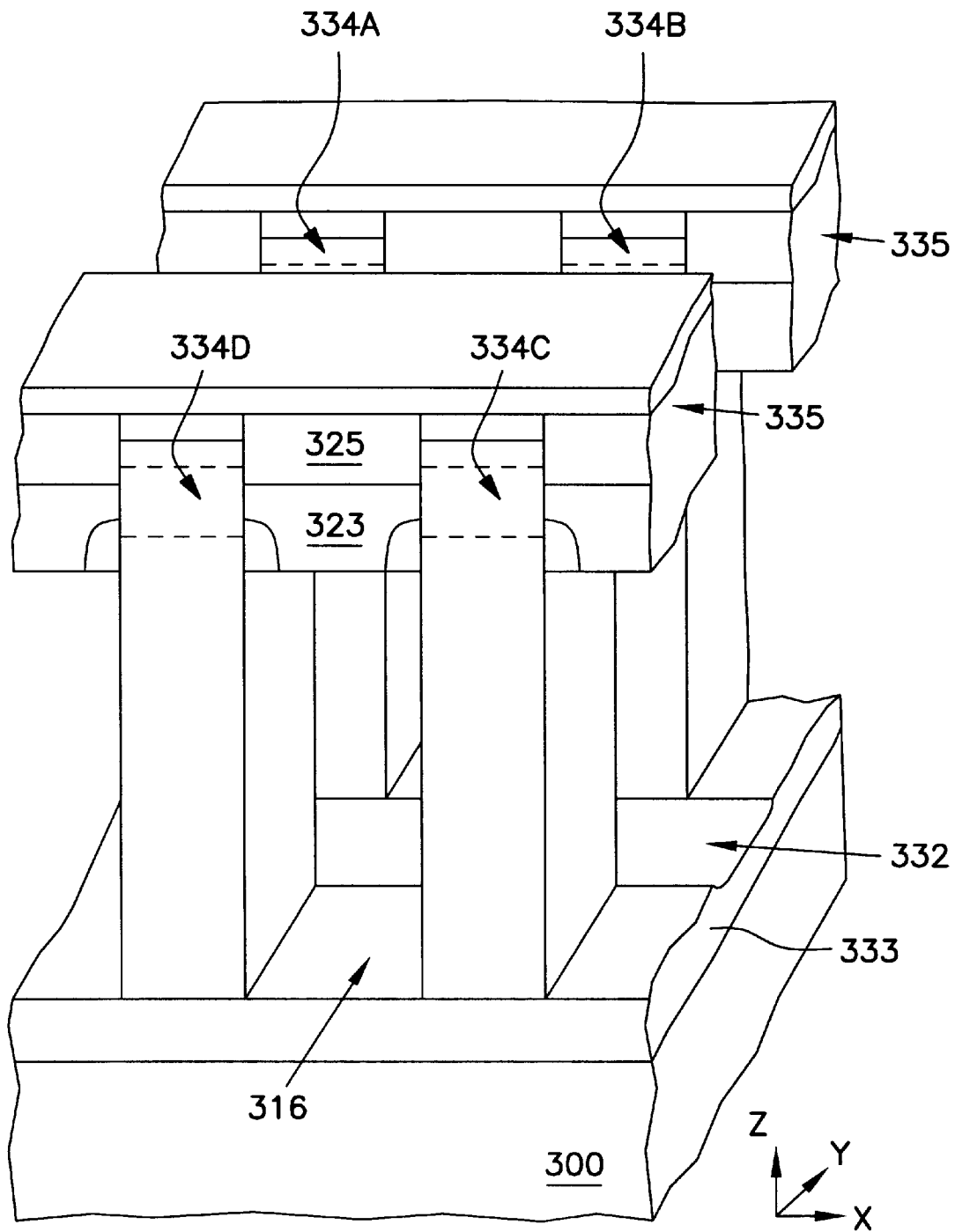

The remaining intrinsic poly-silicon of layer 320 is removed by an isotropic etch using an etchant that is known in the art to attack intrinsic silicon preferentially, e.g., KOH and alcohol, ethylene diamine and pyrocatechol or gallic acid. This undercuts and leaves bridges 335 that include body contacts 323 and overlying oxide layers 325 between adjacent pillars of single crystal silicon as shown in FIG. 5J. An isotropic etch is used to remove all exposed thermal oxide from the surface of pillars 334A through 334D.

Figure 5K:
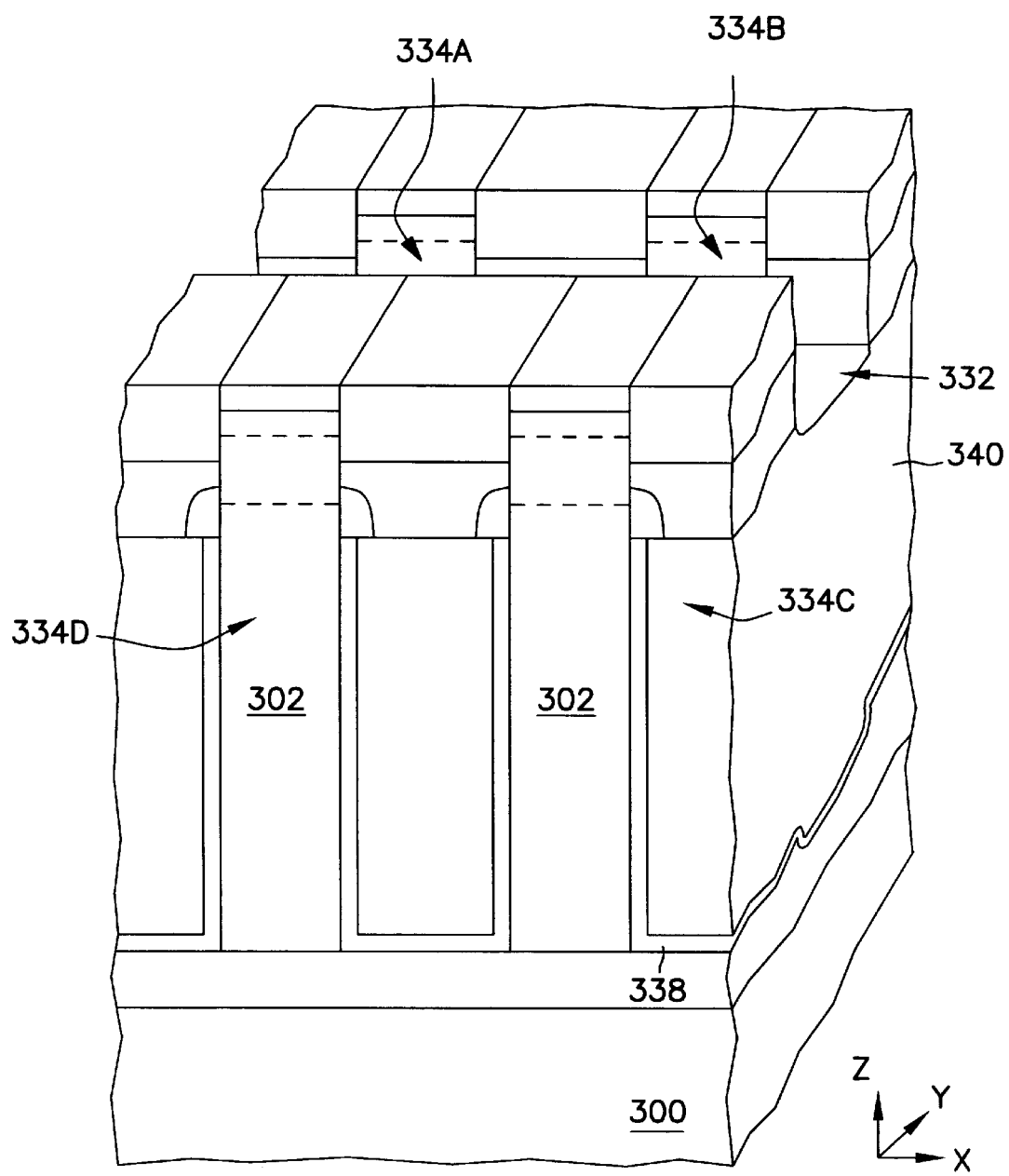

Next, insulator layer 338 is formed by depositing an insulator material in trenches 316 and 332. Layer 338 is used as the insulator layer for the storage capacitors in array 299. A common plate for all of the memory cells of array 299 is formed by a chemical vapor deposition of N+ poly-silicon or other appropriate refractory conductor in column isolation trenches 316 and row isolation trenches 332. In this manner, conductor mesh or grid 340 is formned so as to surround each of pillars 334A through 334D. Mesh 340 is planarized and etched back to a level approximately at the bottom of bridges 335 as shown in FIG. 5K. An additional etch is performed to remove any remaining exposed insulator material of layer 338 from the sides of semiconductor pillars 334A through 334D above mesh 340.

Figure 5L:
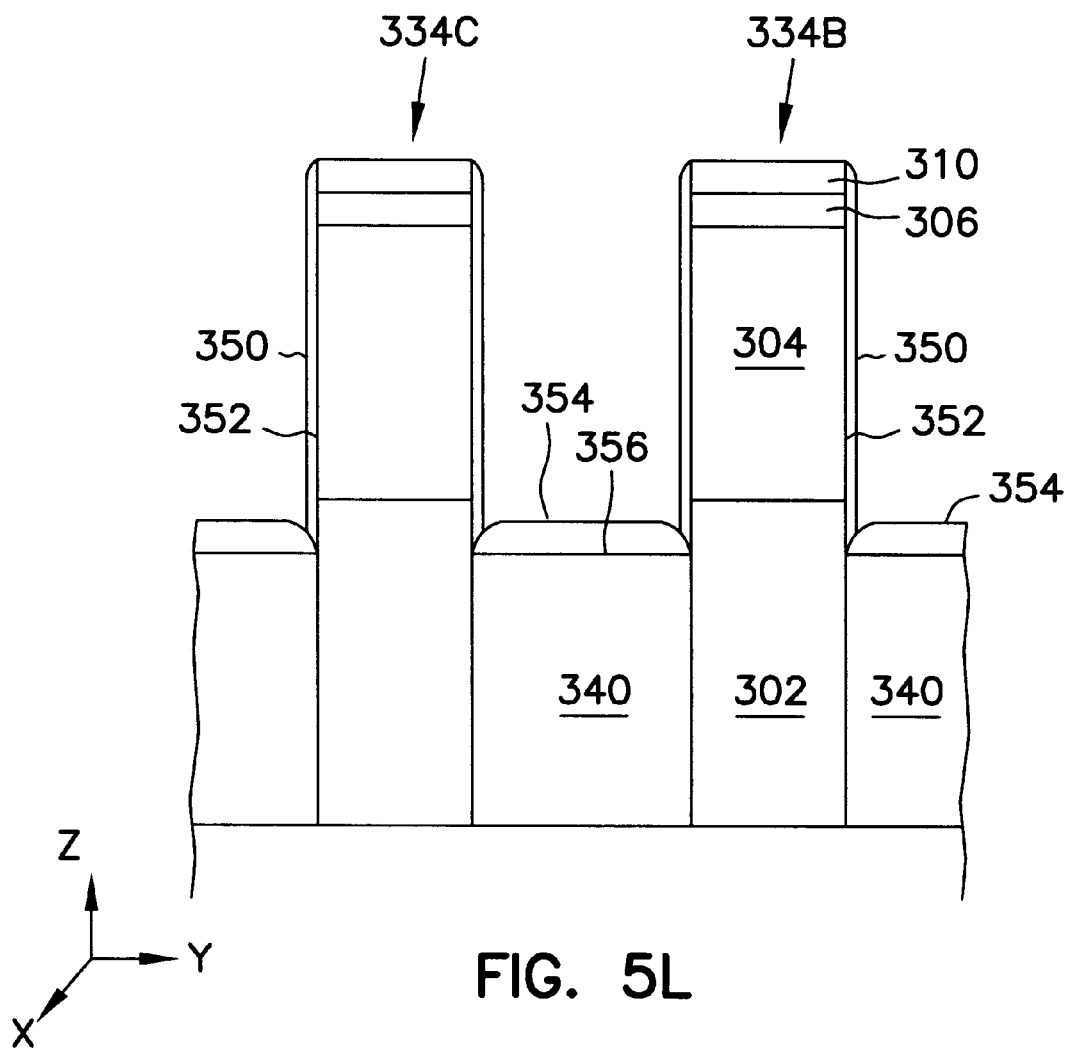

Referring to FIG. 5L, layer 350 of silicon nitride ($Si_3N_4$) is formed by, for example, chemical vapor deposition to a thickness of approximately 20 nanometers. Layer 350 is directionally etched to leave silicon nitride on sidewalls 352 of pillars 344B and 344C as shown in FIG. 5L. It is noted that silicon nitride is also deposited on the sidewalls of pillars 334A and 334B. Layer 354 of thermal silicon dioxide ($SiO_2$) is grown or deposited to a thickness of approximately 100 nanometers on exposed surfaces 356 of mesh 340. Layer 350 is then removed. The remaining portions of nitride mask layer 327 are also removed.

Figure 5M:
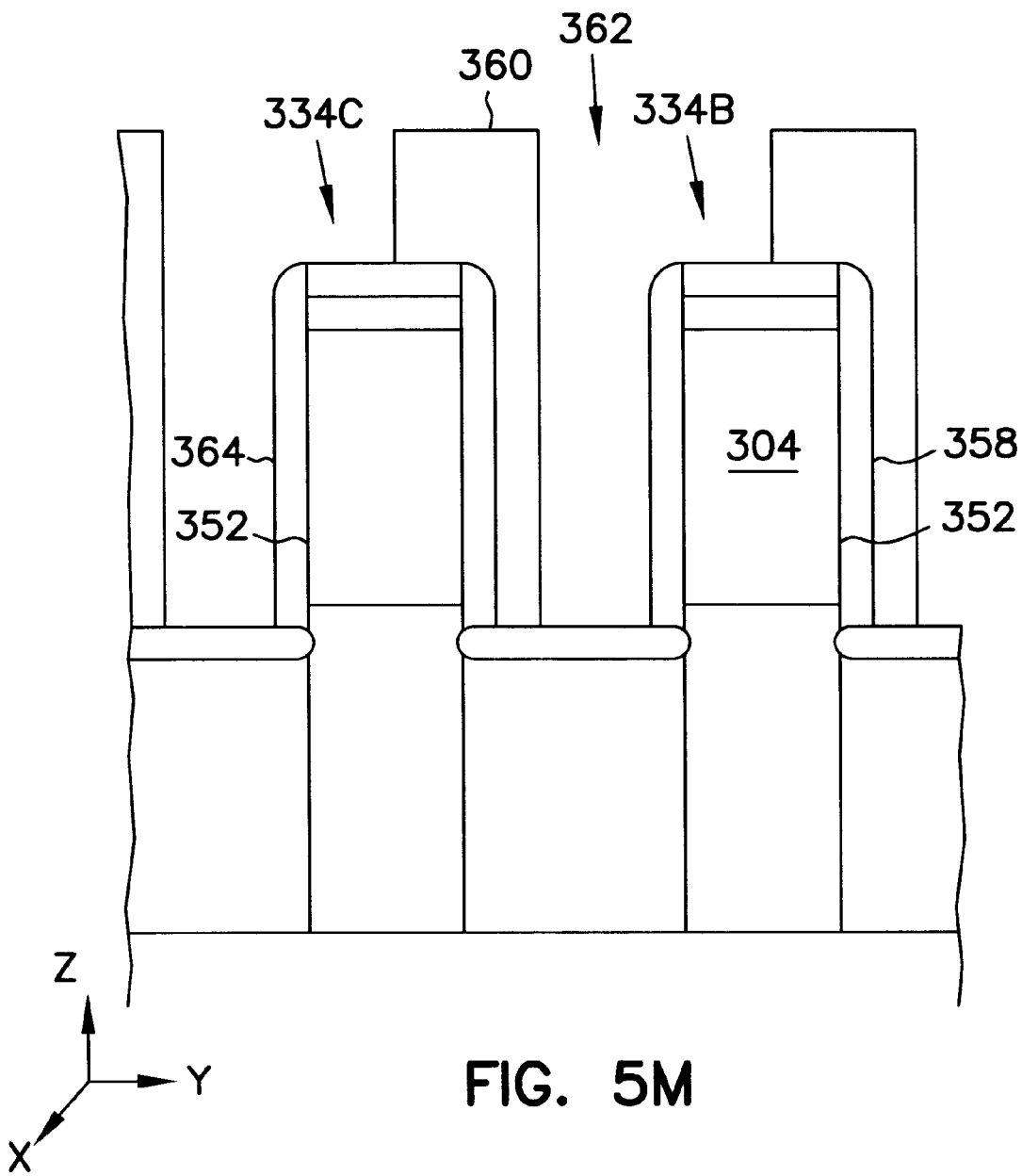

Referring to FIG. 5M, layer 358 of intrinsic poly-silicon is deposited, for example, by chemical vapor deposition with a thickness of approximately 50 nanometers. Layer 358 is directionally etched to the leave intrinsic poly-silicon on sidewalls 352 of pillars 334B and 334C as shown in FIG. 5M. It is noted that layer 358 is also formed on pillars 334A and 334D.

Figure 5N:
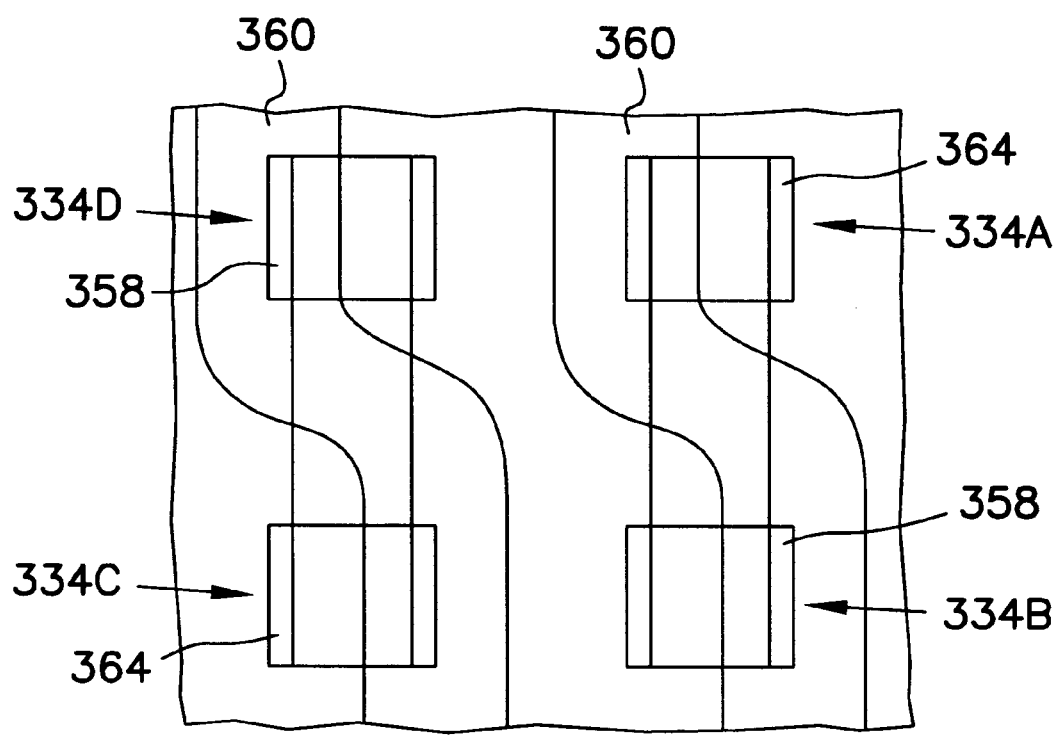
Figure 50:
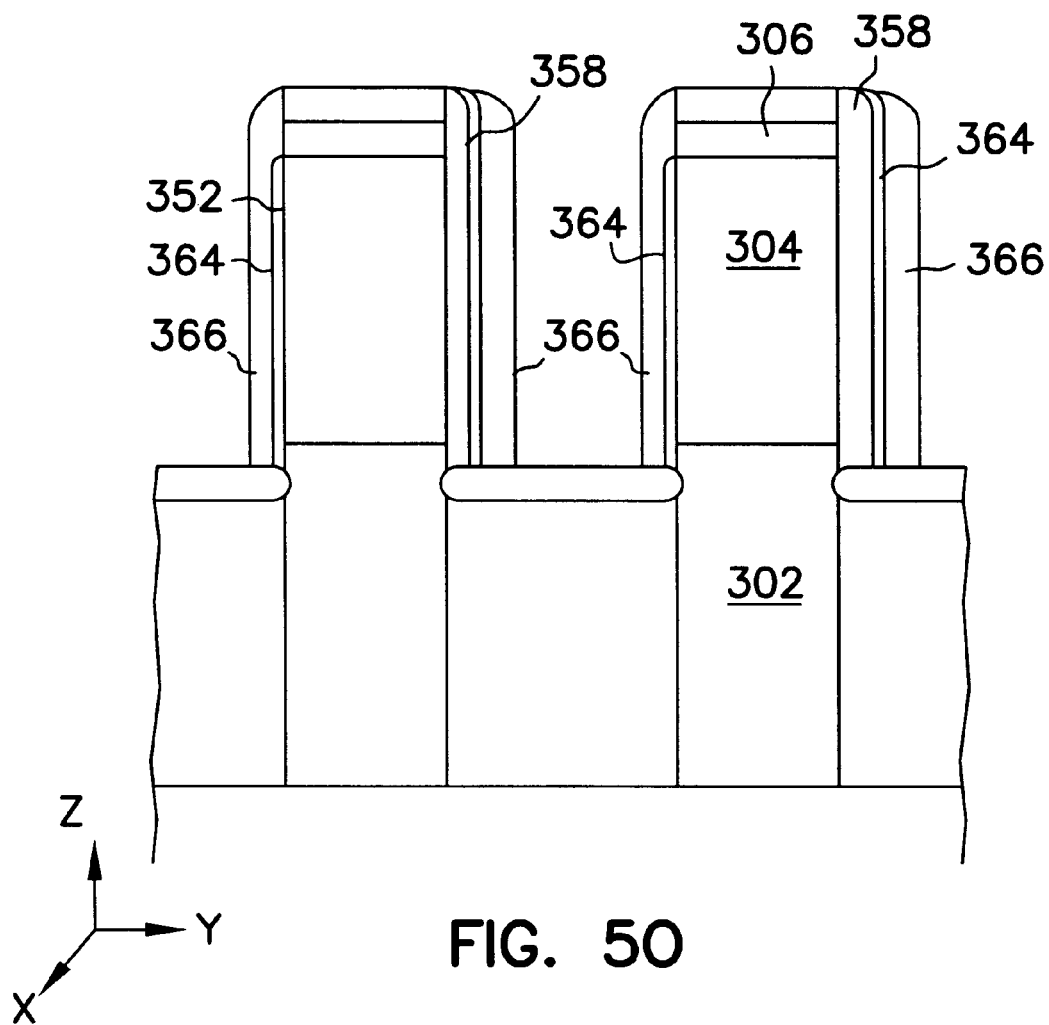

As shown in FIGS. 5M and 5N, layer 360 of photo resist material is deposited and masked to expose alternate sidewalls 352 of pillars 334A through 334D. Exposed portions of layer 358 in openings 362 through photo resist layer 360 are selectively etched to expose sidewalls 352 of pillars 334A through 334D. Photo resist layer 360 is removed and gate oxide layer 364 is grown on exposed sidewalls 352 of pillars 334A through 334D. Additionally, gate oxide layer 364 is also grown on remaining intrinsic poly-silicon layers 358.

Referring to FIG. 5O, word line conductors 366 are deposited by, for example, chemical vapor deposition of n+ poly-silicon or other refractory metal to a thickness of approximately 50 nanometers. Conductors 366 are directionally and selectively etched to leave on sidewalls 352 of pillars 334A through 334D and on exposed surfaces of intrinsic poly-silicon layer 358.

Figure 5P:
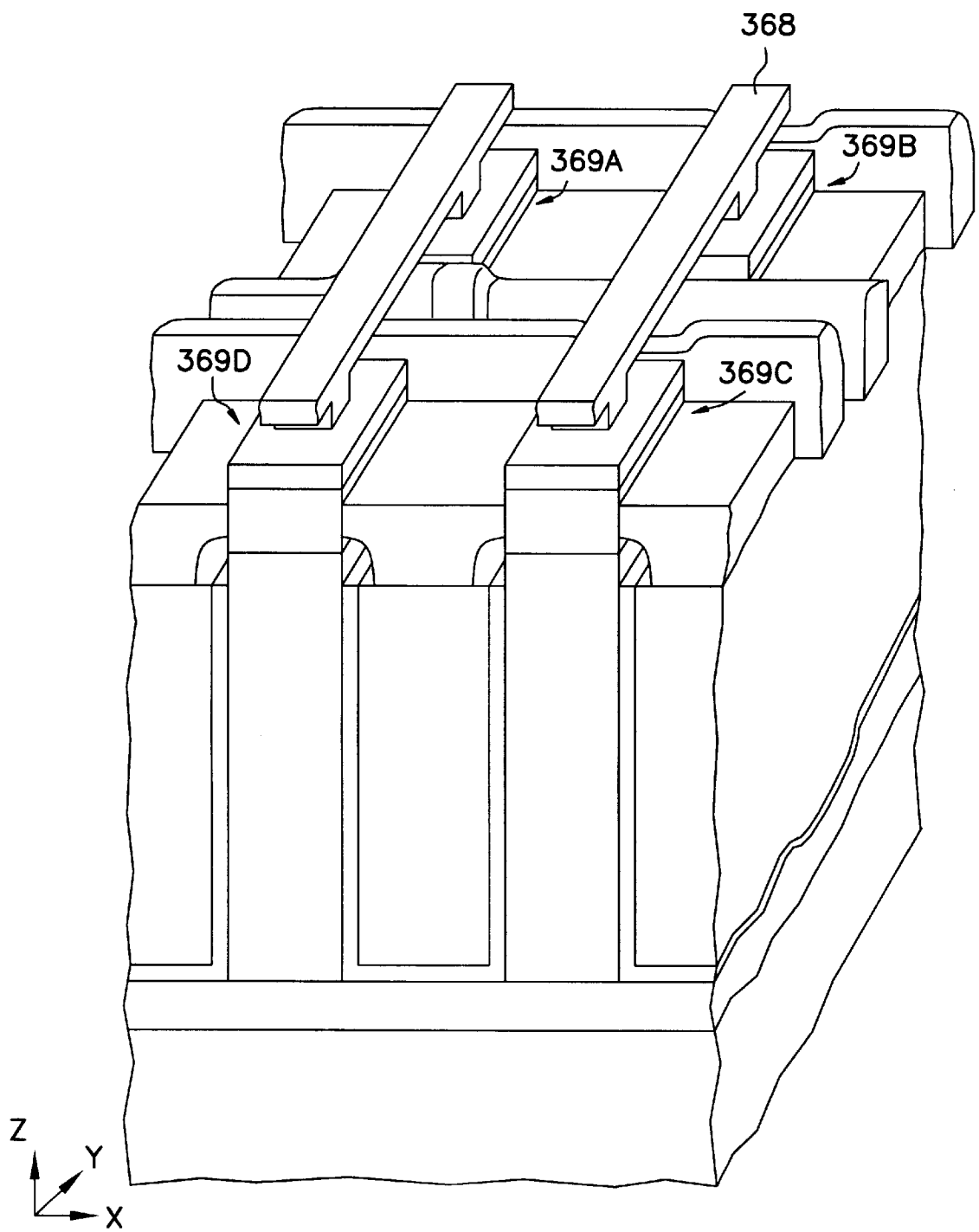

Next, a brief oxide etch is used to expose the top surface of intrinsic poly-silicon layer 358. Layer 358 is then selectively etched to remove the remaining intrinsic poly-silicon using an etchant such as KOH and alcohol, ethylene and pyrocatechol or gallic acid (as described in U.S. Pat. No. 5,106,987 issued to W. D. Pricer). Word line conductors 366 are etched to recess below a top surface of pillars 334A through 334D. An oxide layer is deposited by, for example, chemical vapor deposition to fill the space vacated by layer 358 and to fill in between word line conductors 366. Additionally conventional process steps are used to add bit lines 368 so as to produce the structure shown in FIG. 5P including memory cells 369A through 369D.

Figure 6A:
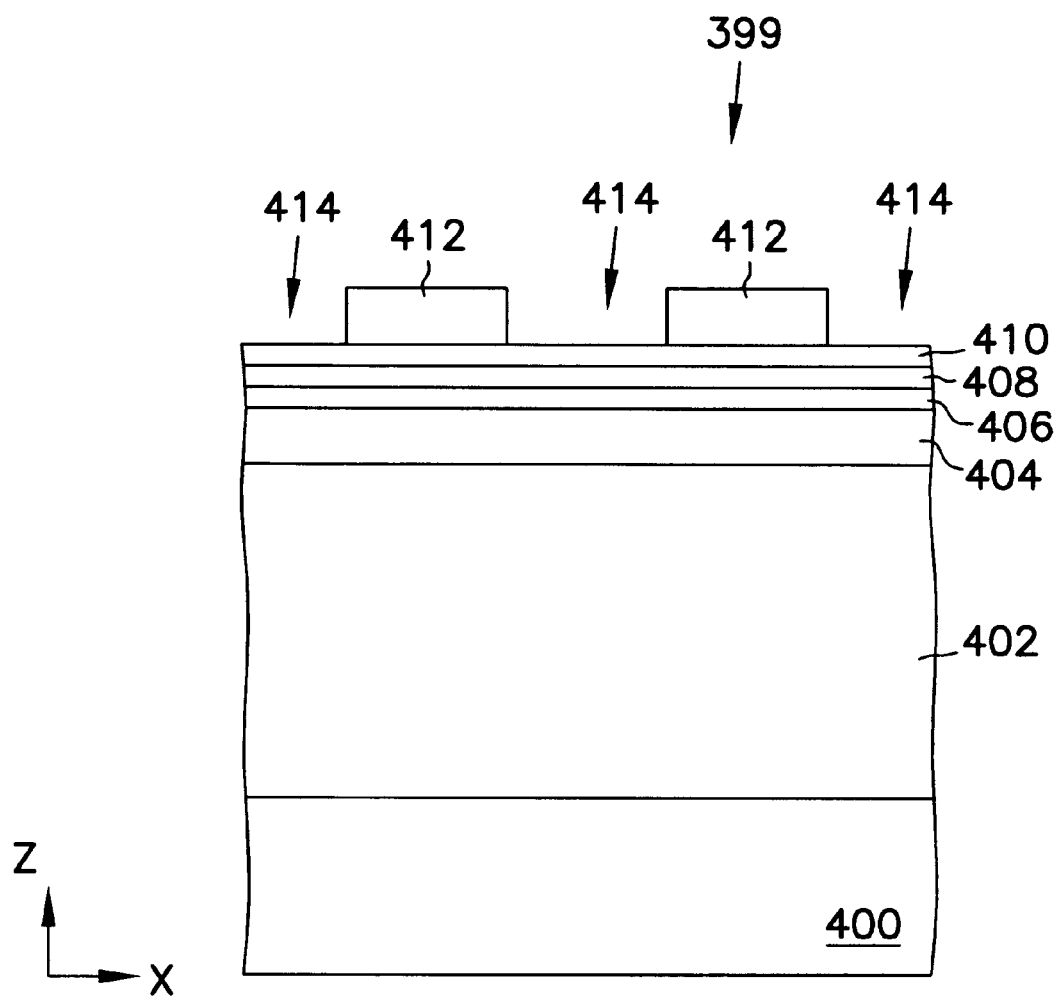
FIGS. 6A through 6O are perspective and elevational views of another embodiment of an integrated circuit that illustrate processing steps for fabricating the integrated circuit according to the teachings of the present invention.

FIGS. 6A through 6O illustrate another embodiment of a process for fabricating an array of memory cells, indicated generally at 399, according to the teachings of the present invention. In this example, dimensions are given that are appropriate to a 0.2 micrometer lithographic image size. For other image sizes, the vertical and horizontal dimensions can be scaled accordingly.

As shown in FIG. 6A, the method begins with substrate 400. Substrate 400 comprises, for example, a P-type silicon wafer, layer of P– silicon material, or other appropriate substrate material. Layer 402 is formed, for example, by epitaxial growth outwardly from layer 400. Layer 402 comprises single crystalline N+ silicon that is approximately 3.5 micrometers thick. Layer 404 is formed outwardly from layer 402 by epitaxial growth of single crystalline P– silicon of approximately 0.5 microns. Layer 406 is formed by ion implantation of donor dopant into layer 404 such that layer 406 comprises single crystalline N+ silicon with a depth of approximately 0.1 microns.

A thin layer of silicon dioxide ($SiO_2$), referred to as pad oxide 408, is deposited or grown on layer 406. Pad oxide 408 has a thickness of approximately 10 nanometers. A layer of silicon nitride ($Si_3N_4$), referred to as pad nitride 410, is deposited on pad oxide 408. Pad nitride 410 has a thickness of approximately 200 nanometers.

Figure 6B:
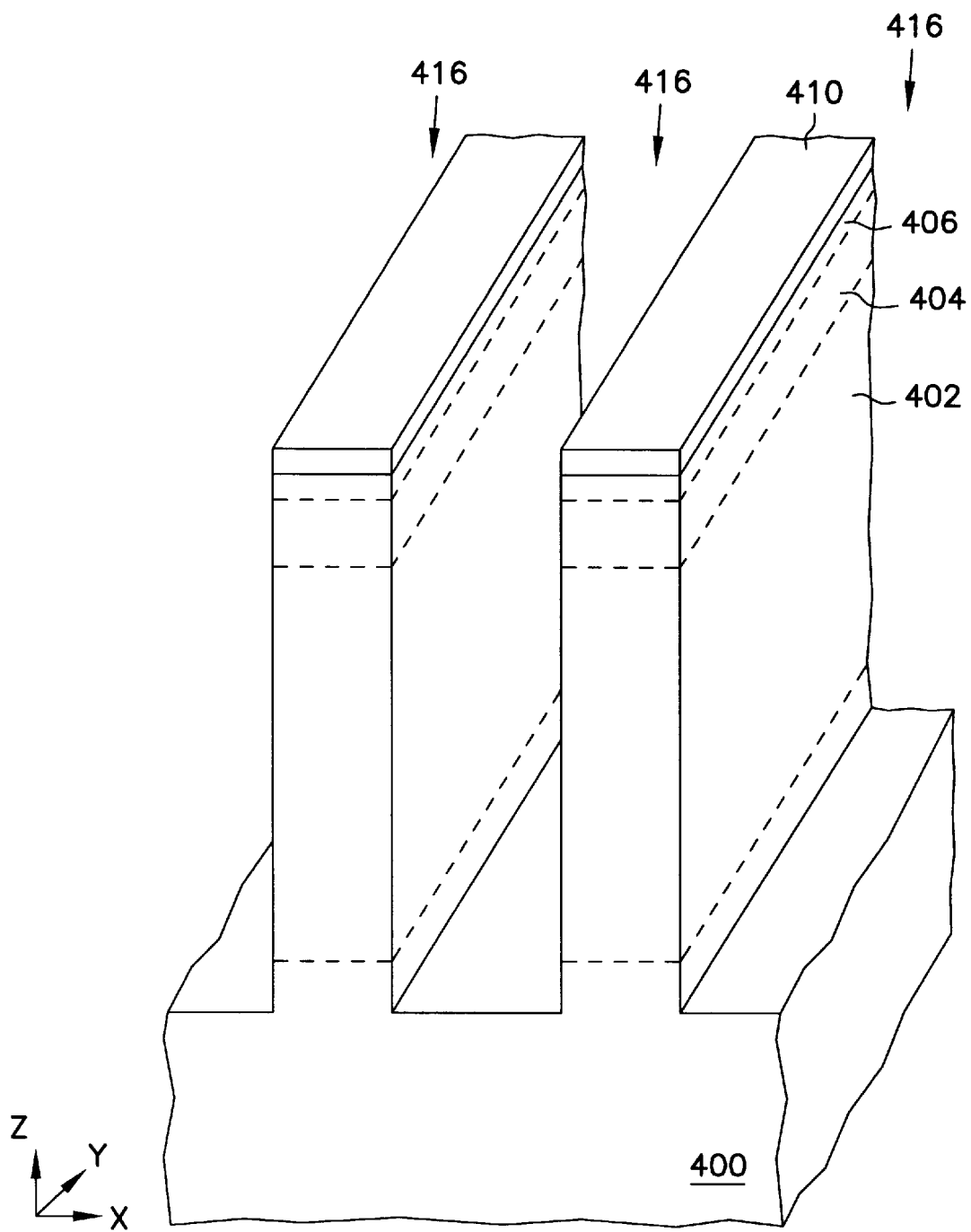
Figure 6C:
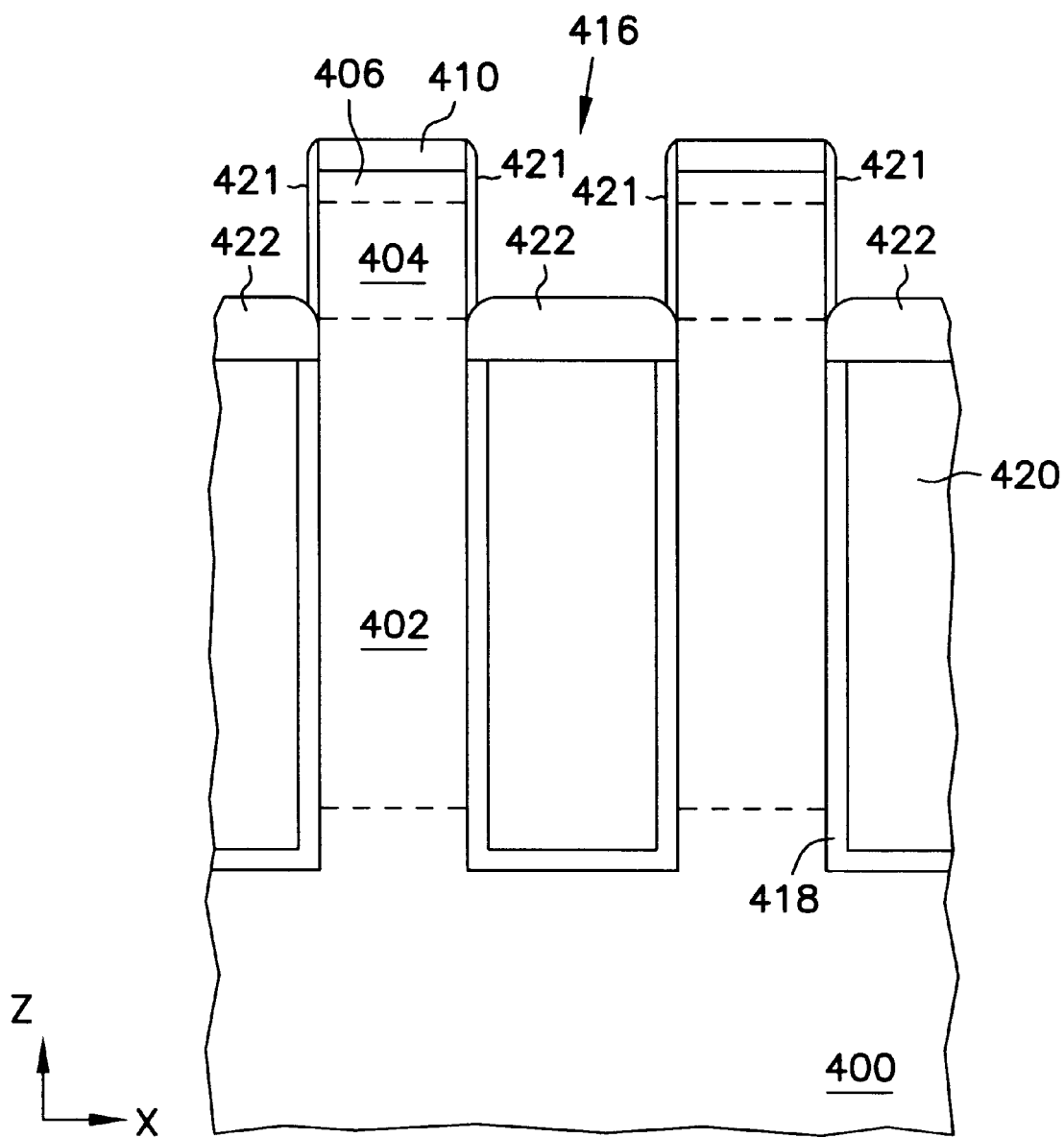

Photo resist layer 412 is deposited outwardly from layer 410. Photo resist layer 412 is patterned with a mask to define openings 414 in layer 412 to be used in selective etching. As shown in FIG. 6B, column isolation trenches 416 are etched through openings 414 in photo resist layer 412 in a direction parallel to which the bit lines will be formed. Column isolation trenches 416 extend down through nitride layer 410, oxide layer 408, N+ layer 406, P– layer 404, N+ layer 402, and into substrate 400.

A thin thermal protective oxide layer 418 is grown to a thickness of approximately 10 nanometers on exposed surfaces of substrate 400 and layers 402, 404, and 406. Layer 418 is used to protect substrate 400 and layers 402, 404 and 406 during subsequent process step.

A layer of intrinsic poly-silicon 420 is deposited by chemical vapor deposition (CVD) to fill column isolation trenches 416. Layer 420 is etched by reactive ion etching (RIE) such that layer 420 is recessed just below a top of layer 402. Nitride layer 421 is formed by depositing nitride with a thickness of approximately 20 nanometers and directionally etching the nitride to leave on vertical sidewalls of trenches 416. Thermal oxide layer 422 is grown on layer 420 in trenches 416. Alternatively, oxide layer 422 can be formed by filling trenches 416 with oxide and etching the oxide back to a thickness of approximately 100 nanometers. Next, nitride layer 421 is stripped from the sidewalls of trench 416 using an isotropic etchant such as phosphoric acid.

Figure 6D:
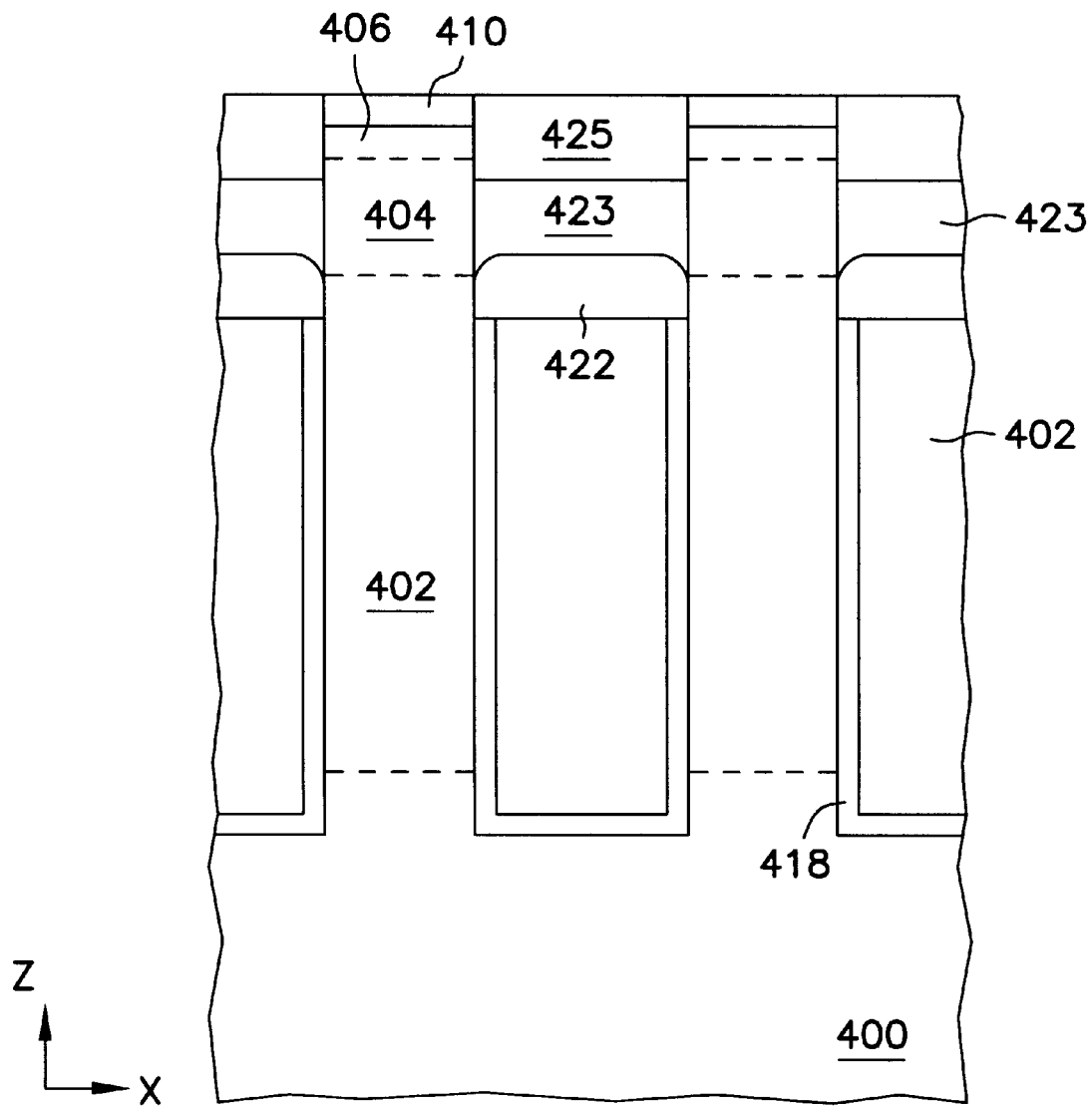

A layer of p+ poly-silicon is formed in trenches 416 by, for example, chemical vapor deposition. The layer of p+ poly-silicon is planarized and etched back to below the junction of layers 404 and 406 to form body contacts 423. Nitride layer 425 is formed by, for example, chemical vapor deposition to fill trenches 416. Nitride layer 425 is planarized by, for example, chemical/mechanical polishing to bring a working surface of layer 425 co-planar with a working surface of layer 410. This leaves the structure shown in FIG. 6D.

Figure 6E:
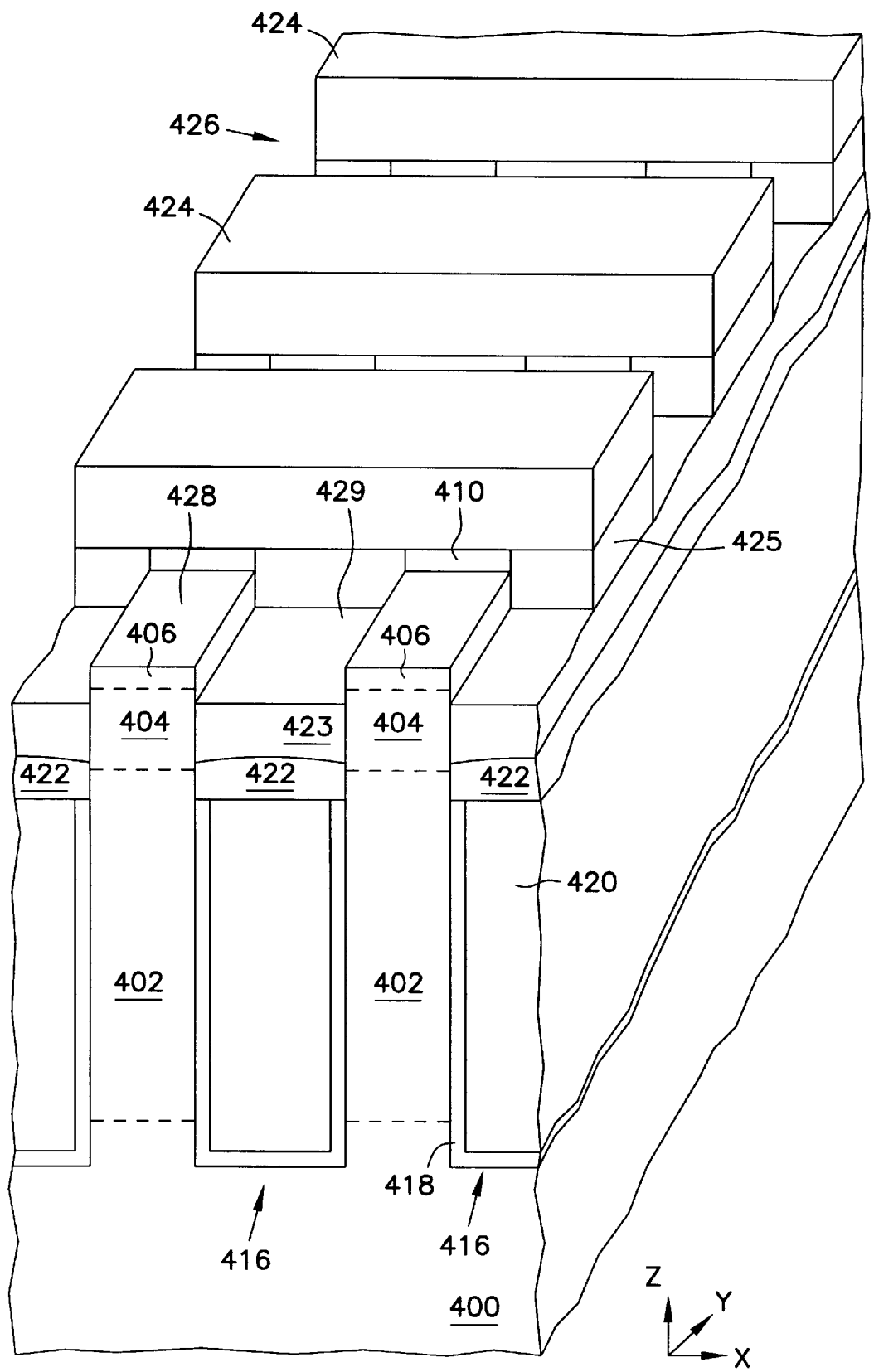

As shown in FIG. 6E, layer 424 of photo resist material is deposited outwardly from nitride layers 410 and 425. Layer 424 is exposed through a mask to define openings 426 in layer 424. Openings 426 are orthogonal to trenches 416 that were filled by intrinsic poly-silicon layer 420, layer 422, body contacts 423, and nitride layer 425. Next, nitride in layers 410 and 425 is etched to a depth sufficient to expose working surface 428 of single crystal silicon layer 406 and working surface 429 of poly-silicon body contacts 423.

Figure 6F:
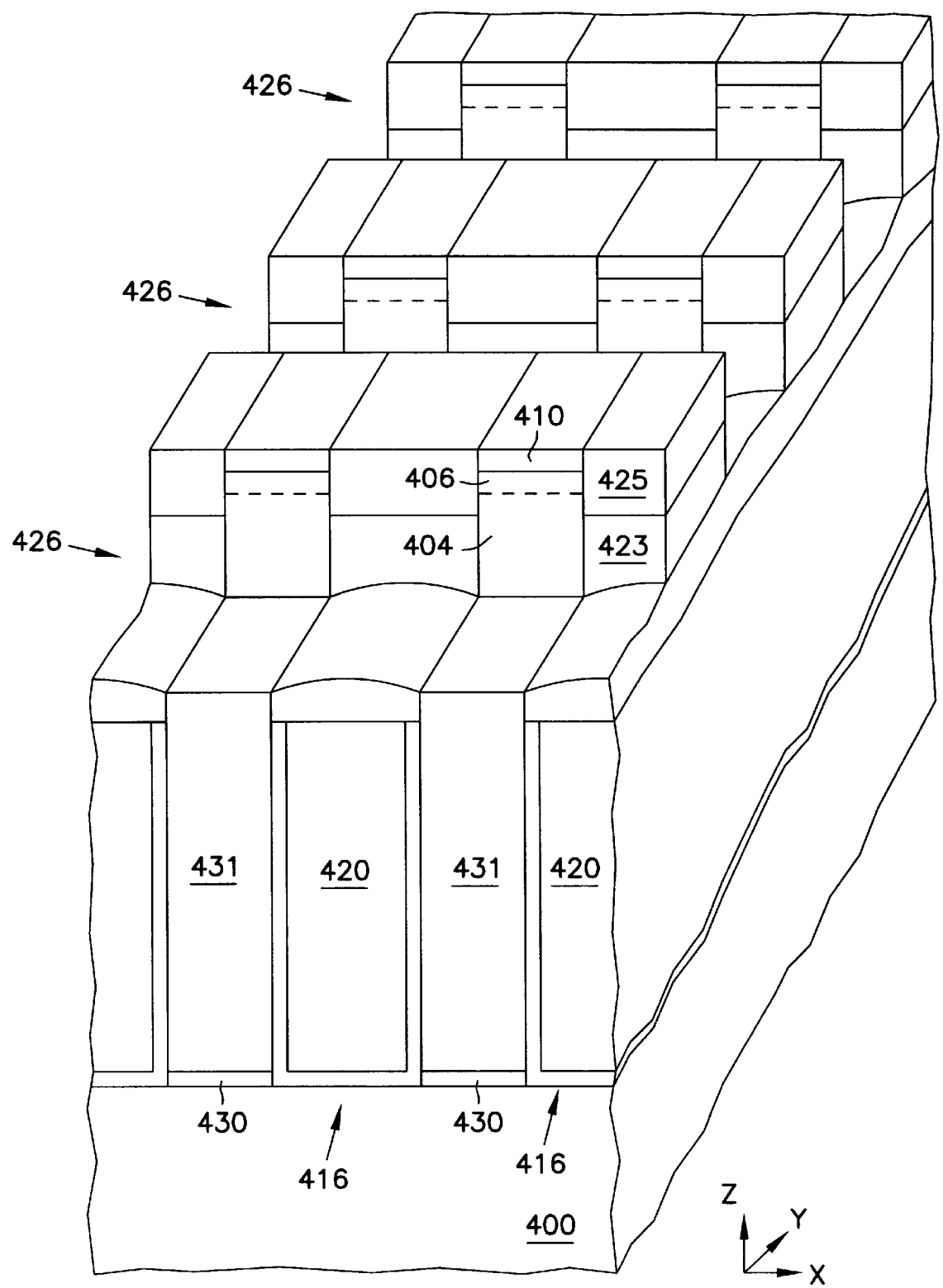

As shown in FIG. 6F, the portion of layers 406, 404, and 402 that are exposed in openings 426 are selectively etched down to a distance approximately equal to column isolation trenches 416. This etch also removes exposed portions of body contacts 423 down to thermal oxide layer 422. Layer 424 is removed and a thin thermal protective oxide 430 is grown on the exposed silicon of layers 402, 404 and 406 as well as an exposed upper surface of layer 400. Layer 431 of intrinsic poly-silicon is formed by, for example, chemical vapor deposition to refill the trenches left by the etch of layers 402, 404, and 406 and body contacts 423 in openings 426. Layer 431 is directionally etched with an etchant that is selective to nitride, e.g., the etchant will not attack nitride, until layer 422 (oxide) is exposed in openings 426. This leaves the structure shown in FIG. 6F.

Figure 6G:
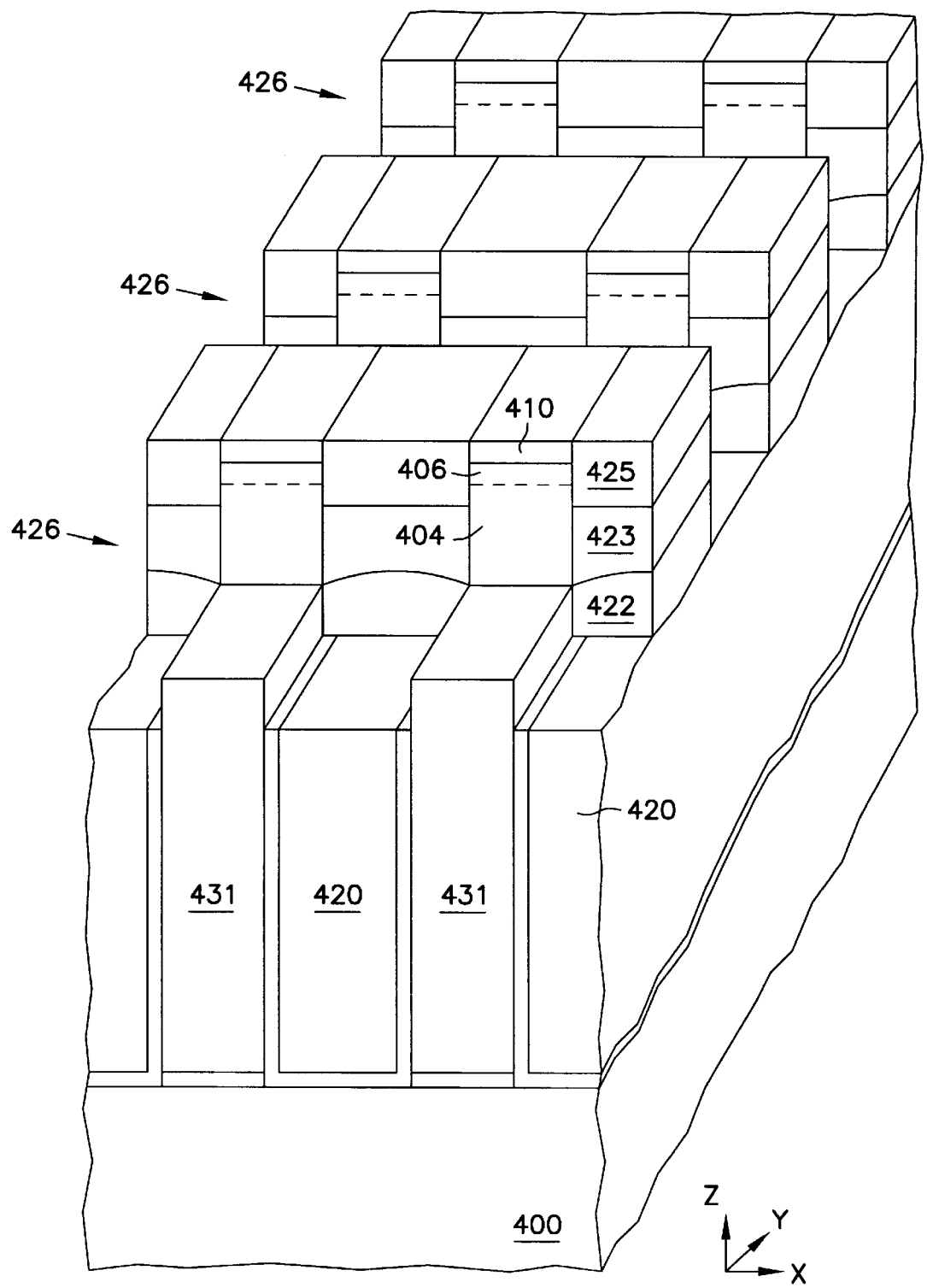
Figure 6H:
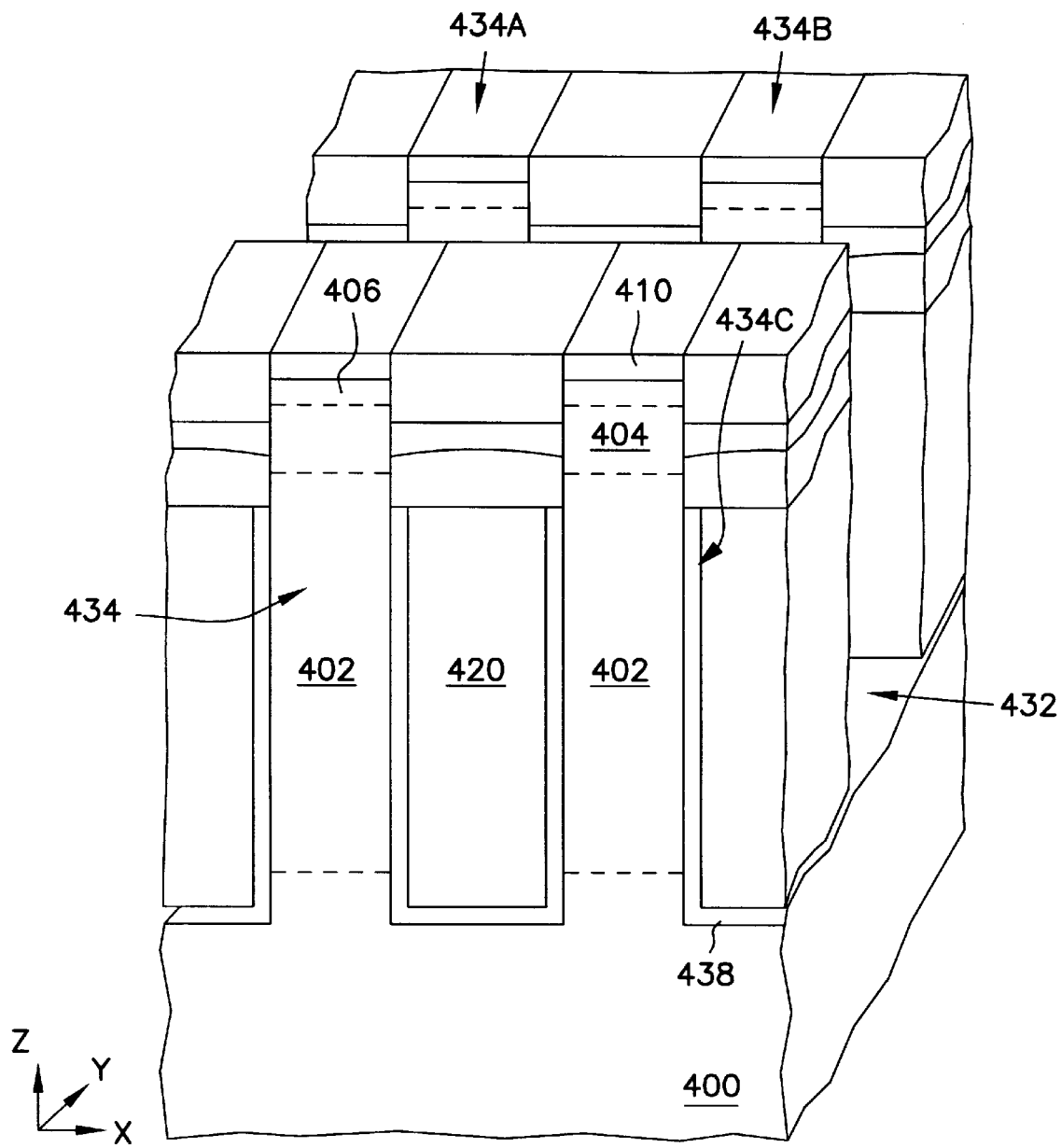
Figure 61:
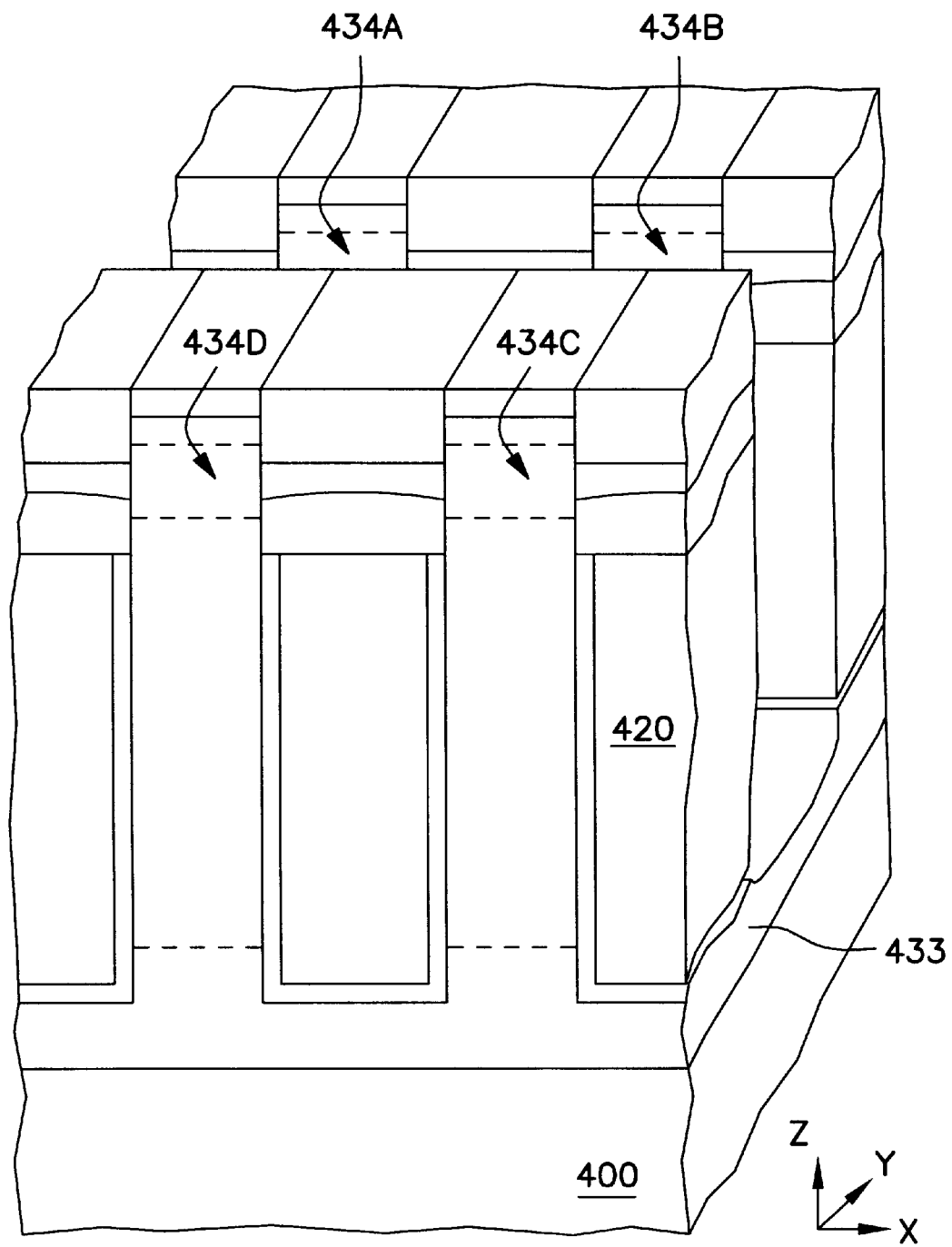

Layer 422 exposed in openings 426 is selectively, directionally etched to expose layer 420 (intrinsic poly-silicon) leaving the structure shown in FIG. 6G. Next, the directional etch of intrinsic poly-silicon, selective to nitride, is resumed so as to remove the remaining portions layers 420 and 431. This etch stops on oxide layer 430 at the bottom of trench 432. This leaves the structure with trenches 432 and single crystal silicon pillars 434A through 434D as shown in FIG. 6H.

Nitride is deposited by chemical vapor deposition in trenches 432 to a thickness of approximately 20 nanometers. The nitride is directionally etched to leave on the vertical sidewalls of trenches 432. Next, an isotropic oxide etch is used to remove all exposed thin oxide.

Thermal oxide layer 433 is formed beneath single crystal silicon pillars 434A through 434D. This is accomplished by an isotropic silicon etch that etches both single crystal and intrinsic poly-silicon downward and laterally to completely undercut pillars 434A through 434D. Although completely undercut, pillars 434A through 434D are supported by contact with original crystal at the ends. Next, thermal oxide layer 433 is grown with a thickness of approximately 0.1 micrometers (for 0.2 micrometer CD) beneath pillars 434A through 434D. The nitride is removed from the sidewalls of trenches 432 to expose the remaining intrinsic poly-silicon of layer 420. It is noted that pillars 434A through 434D are still covered with protective oxide 430. At this point the structure is as shown in FIG. 6I.

Figure 6J:
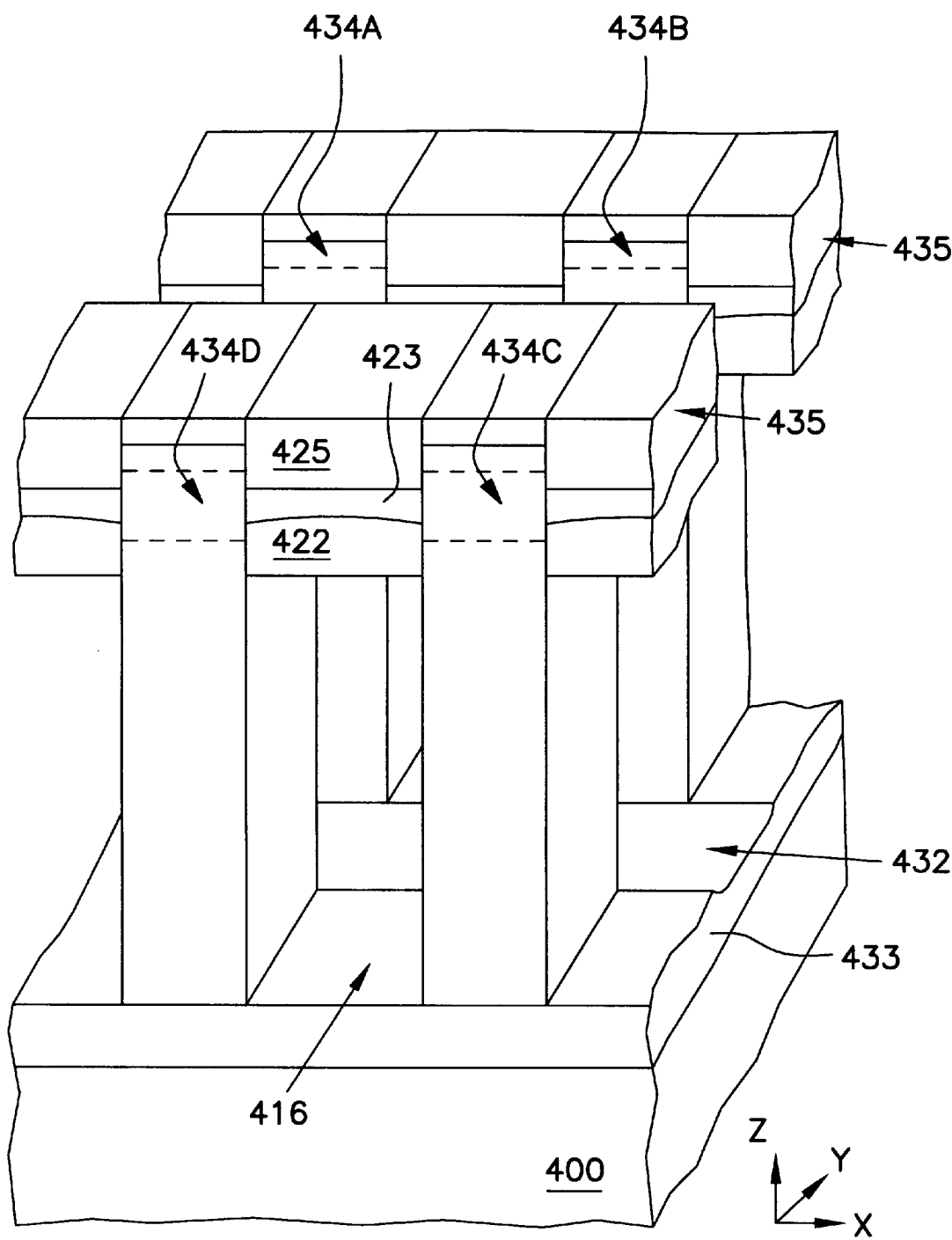

The remaining intrinsic poly-silicon of layer 420 is removed by an isotropic etch using an etchant that is known in the art to attack intrinsic silicon preferentially, e.g., KOH and alcohol, ethylene diamine and pyrocatechol or gallic acid. This undercuts and leaves bridges 435 that include oxide layers 422, body contacts 423 and overlying nitride layers 425 between adjacent pillars of single crystal silicon as shown in FIG. 6J. An isotropic etch is used to remove all exposed thermal oxide from the surface of pillars 434A through 434D.

Optional metal contact 437 can be formed in trenches 432. For example, exposed oxide layer 433 in trenches 432 is etched down to expose underlying layer 400. A refractory metal, e.g., Ti, W, is deposited by collimated deposition onto the exposed surface of layer 400 to form metal contact 437.

Figure 6K:
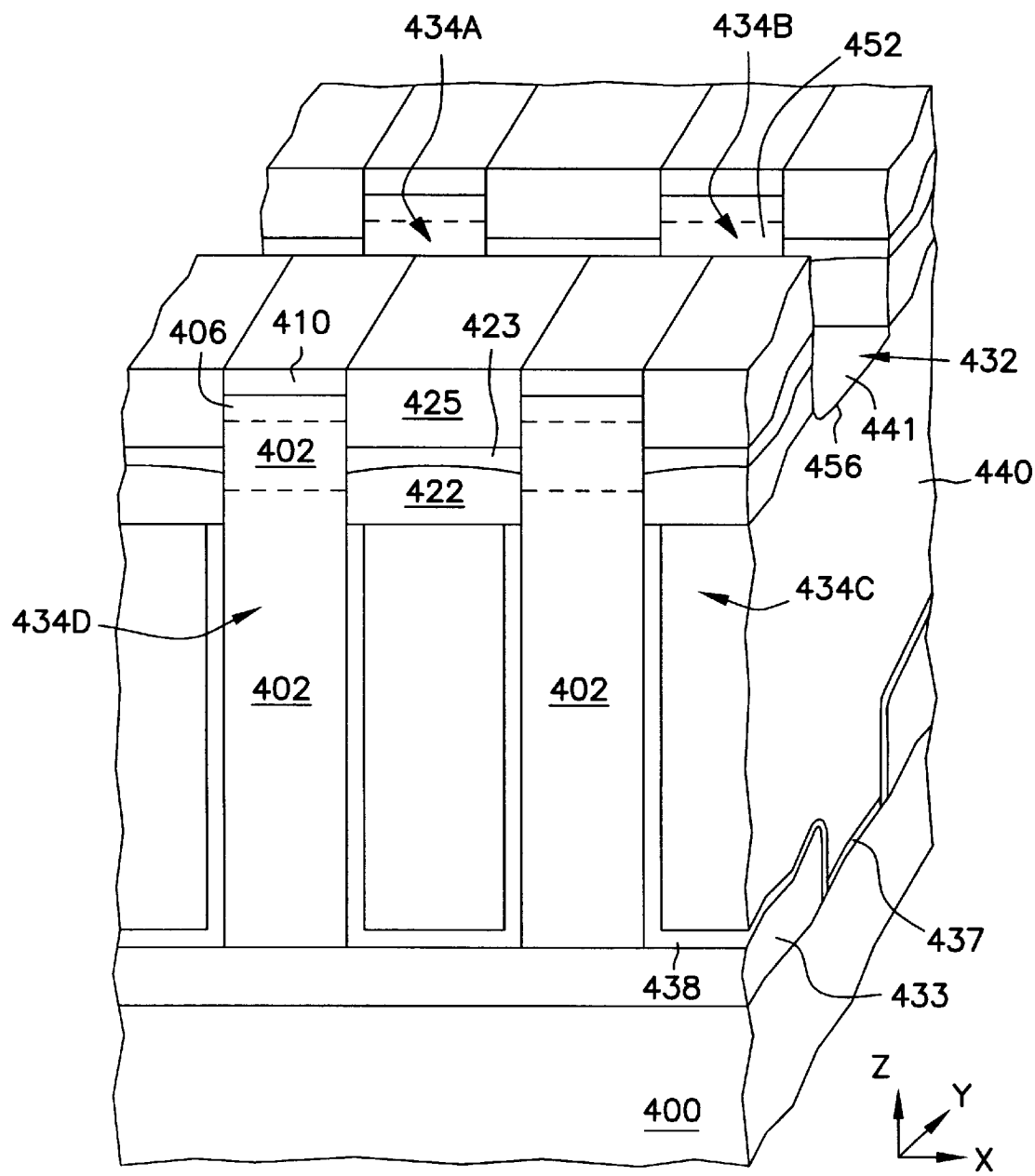

Next, insulator layer 438 is formed by depositing an insulator material in trenches 416 and 432. Layer 438 is used as the insulator layer for the storage capacitors in array 399. In embodiments involving metal contact 437, layer 438 is directionally etched to remove layer 438 from the bottom of trenches 432 to expose metal contact 437. A common plate for all of the memory cells of array 399 is formed by a chemical vapor deposition of N+ poly-silicon or other appropriate refractory conductor in column isolation trenches 416 and row isolation trenches 432. In this manner, conductor mesh or grid 440 is formed so as to surround each of pillars 434A through 434D. Mesh 440 is planarized and etched back to a level approximately at the bottom of bridges 435 as shown in FIG. 6K. An additional etch is performed to remove any remaining exposed insulator material of layer 438 from the sides of semiconductor pillars 434A through 434D above mesh 440. Silicon nitride ($Si_3N_4$) deposited by, for example, chemical vapor deposition to a thickness of approximately 20 nanometers. The silicon nitride layer is directionally etched to leave silicon nitride on sidewalls 452 of pillars 444A through 444D. Layer 441 of thermal silicon dioxide ($SiO_2$) is grown to a thickness of approximately 100 nanometers on exposed surfaces 456 of mesh 440. The nitride on surfaces 452 is then removed.

Figure 6L:
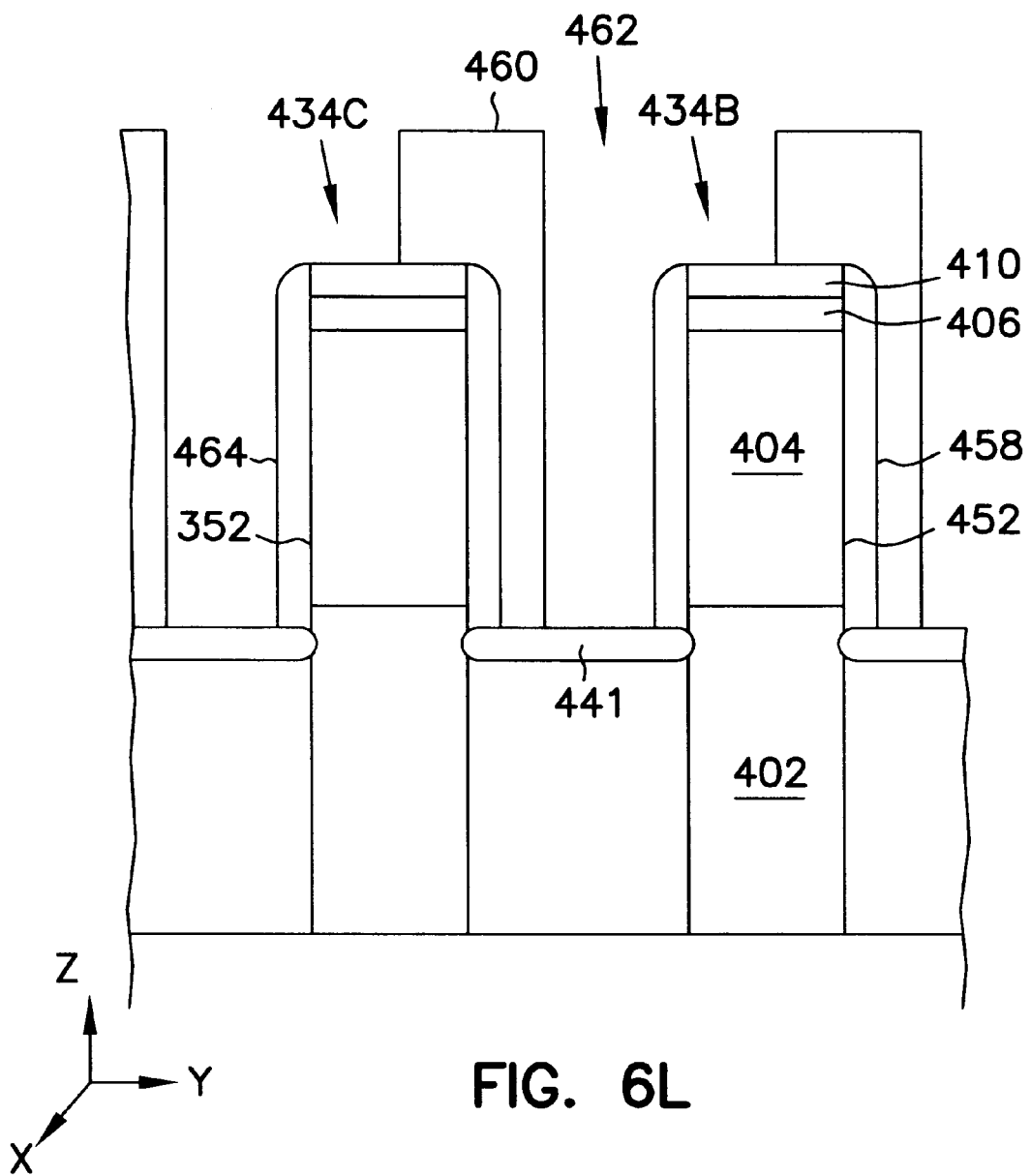

Referring to FIG. 6L, layer 458 of intrinsic poly-silicon is deposited, for example, by chemical vapor deposition with a thickness of approximately 50 nanometers. Layer 458 is directionally etched to the leave intrinsic poly-silicon on sidewalls 452 of pillars 434B and 434C. It is noted that layer 458 is also formed on pillars 434A and 434D.

Figure 6M:
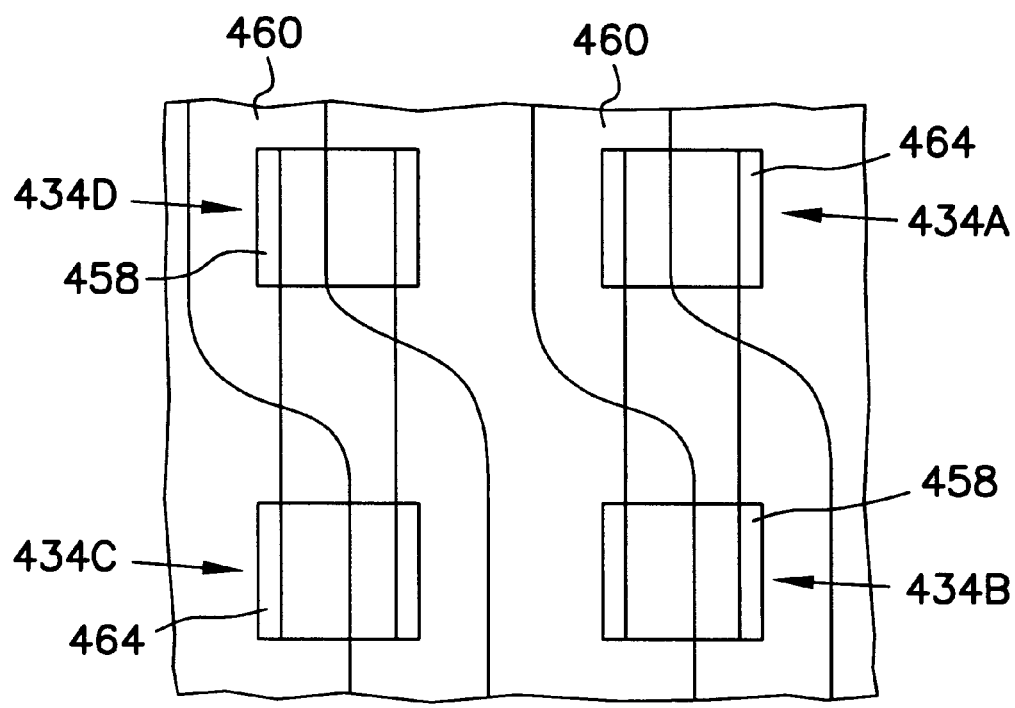

As shown in FIGS. 6L and 6M, layer 460 of photo resist material is deposited and masked to expose alternate sidewalls 452 of pillars 434A through 434D. Exposed portions of layer 458 in openings 462 through photo resist layer 460 are selectively etched to expose sidewalls 452 of pillars 434A through 434D. Photo resist layer 460 is removed and gate oxide layer 464 is grown on exposed sidewalls 452 of pillars 434A through 434D. Additionally, gate oxide layer 464 is also grown on remaining intrinsic poly-silicon layers 458.

Figure 6N:
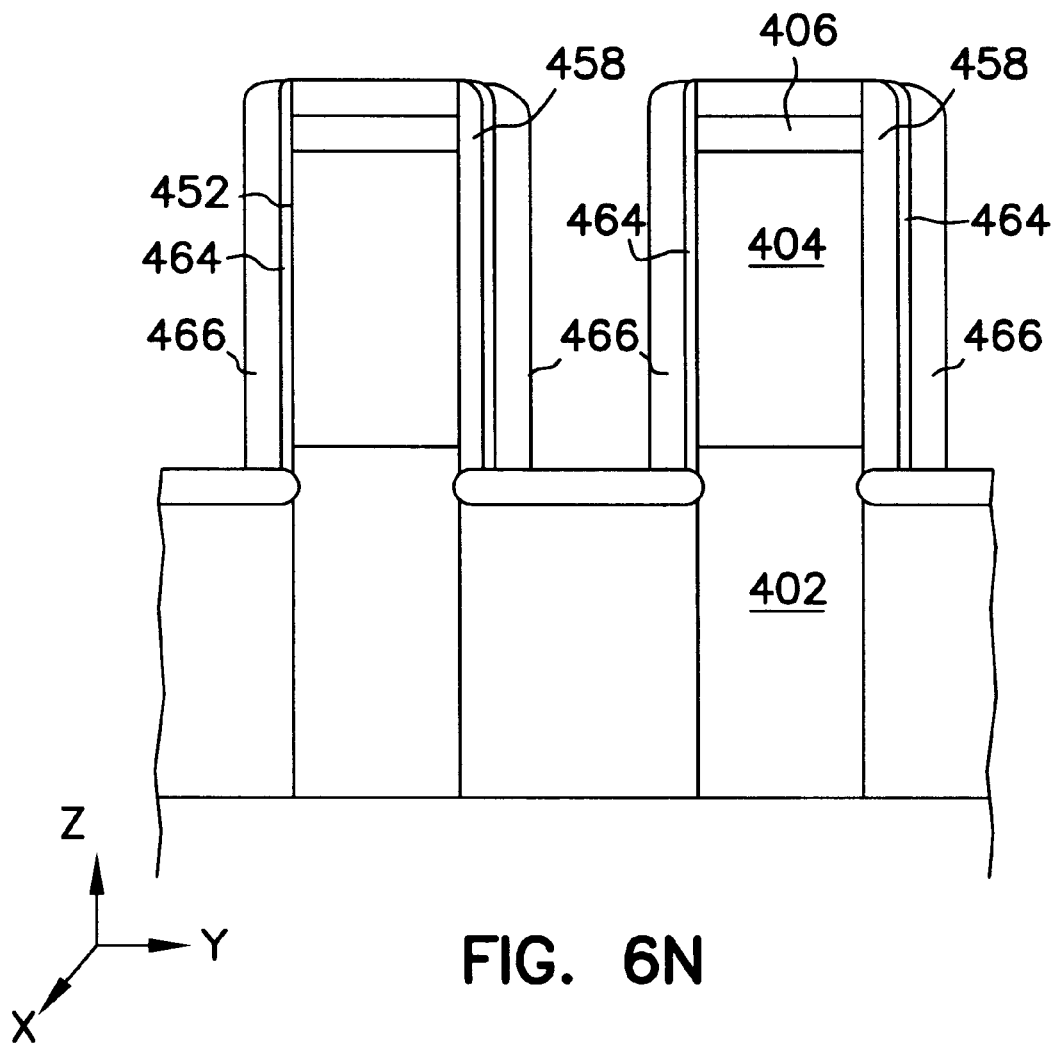
Figure 60:
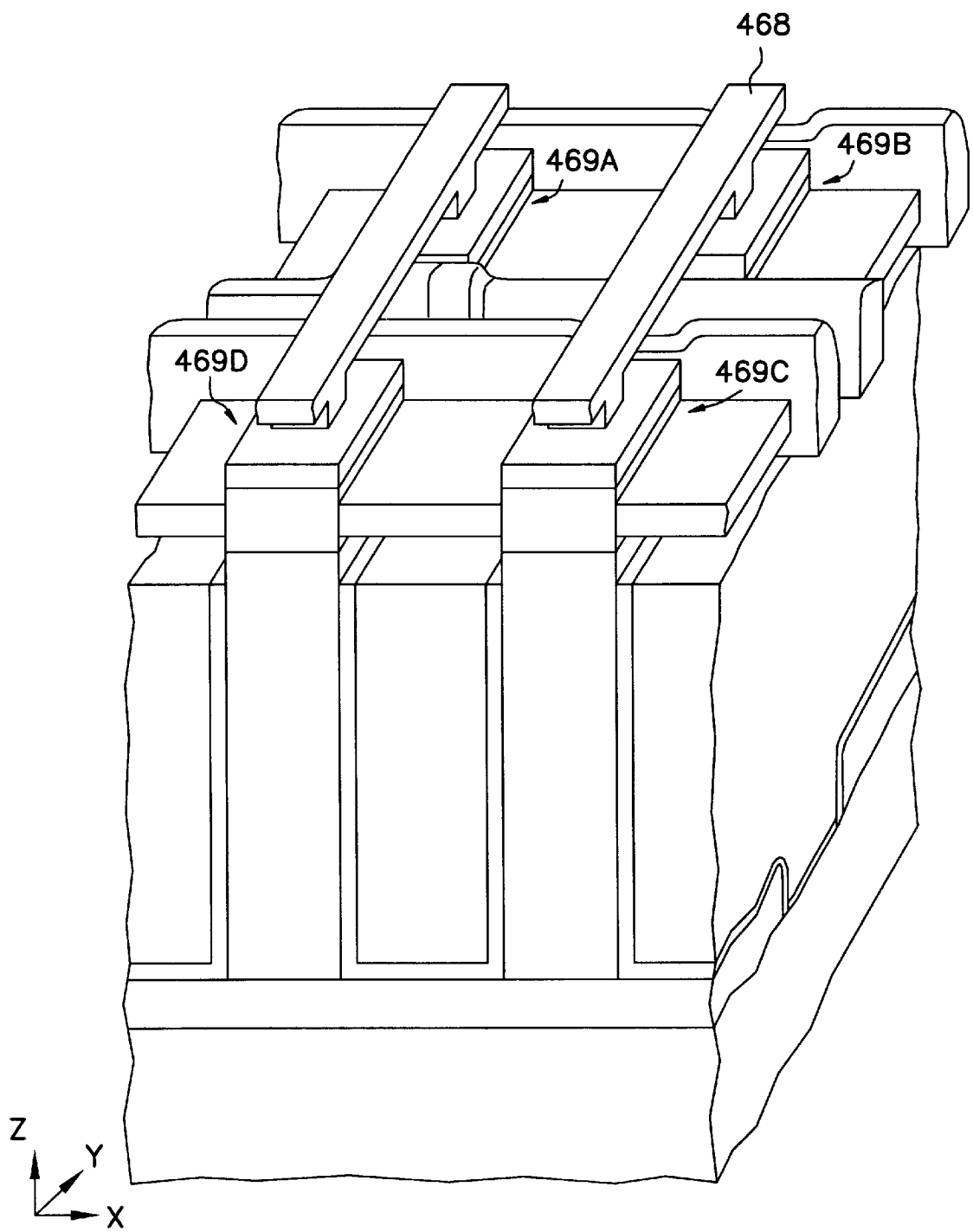

Referring to FIG. 6N, word line conductors 466 are deposited by, for example, chemical vapor deposition of n+ poly-silicon or other refractory metal to a thickness of approximately 50 nanometers. Conductors 466 are directionally and selectively etched to leave on sidewalls 452 of pillars 434A through 434D and on exposed surfaces of intrinsic poly-silicon layer 458.

Next, a brief oxide etch is used to expose the top surface of intrinsic poly-silicon layer 458. Layer 458 is then selectively etched to remove the remaining intrinsic poly-silicon using an etchant such as KOH and alcohol, ethylene and pyrocatechol or gallic acid (as described in U.S. Pat. No. 5,106,987 issued to W. D. Pricer). Word line conductors 466 are etched to recess below a top surface of pillars 434A through 434D. An oxide layer is deposited by, for example, chemical vapor deposition to fill the space vacated by layer 458 and to fill in between word line conductors 466. Additionally conventional process steps are used to add bit lines 468 so as to produce the structure shown in FIG. 6O including memory cells 469A through 469D.

CONCLUSION

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. For example, the semiconductor materials and dimensions specified in this application are given by way of example and not by way of limitation. Other appropriate material can be substituted without departing from the spirit and scope of the invention.

What is claimed is:

1. A memory cell for a memory array in a folded bit line configuration, the memory cell comprising:

an access transistor formed in a pillar of single crystal semiconductor material, the access transistor having first and second source/drain regions and a body region that are vertically aligned;

a body contact coupled to the body region of the access transistor that provides a body bias to the access transistor;

the access transistor further including a gate coupled to a word line disposed adjacent to the body region;

a passing word line separated from the gate by an insulator for coupling to other memory cells adjacent to the memory cell; and a trench capacitor, wherein the trench capacitor includes a first plate that is formed integral with the first source/drain region of the access transistor and a second plate that is disposed adjacent to the first plate and separated from the first plate by a gate oxide.

2. The memory cell of claim 1, wherein the second plate of the trench capacitor surrounds the second source/drain region.

3. The memory cell of claim 1, wherein the body contact couples to a body region of an adjacent access transistor.

4. The memory cell of claim 2, wherein the body contact is coupled to the second plate of the trench capacitor.

5. A memory device, comprising:

an array of memory cells, each memory cell including a vertical access transistor formed of a single crystalline semiconductor pillar that extends outwardly from a substrate with body and first and second source/drain regions, a gate disposed adjacent to a side of the pillar adjacent to the body region and a trench capacitor wherein a first plate of the trench capacitor is integral with the first source/drain region and a second plate of the trench capacitor is disposed adjacent to the first plate;

a number of bit lines that are each selectively coupled to a number of the memory cells at the second source/drain region of the access transistor so as to form columns of memory cells in a folded bit line configuration;

a number of word lines disposed substantially orthogonal to the bit lines in trenches between rows of the memory cells, wherein each trench includes two word lines, each word line coupled to gates of alternate access transistors on opposite sides of the trench; and a number of body contacts disposed between adjacent access transistors in a row of memory cells.

6. The memory device of claim 5, wherein the pillars are disposed on an oxide layer.

7. The memory device of claim 5, wherein a surface area of the memory cell is $4F^2$, where F is a minimum feature size.

8. The memory device of claim 5, wherein the second plate of the trench capacitor surrounds the second source/drain region of the access transistor.

9. The memory device of claim 5, wherein the second plate of the trench capacitor is maintained at approximately ground potential.

10. The memory device of claim 5, wherein the number of body contacts are coupled to a second plate that is common to all of the trench capacitors.

11. The memory device of claim 5, wherein the number of body contacts are coupled between body regions of adjacent access transistors.

12. The memory device of claim 5, wherein the word lines are sub-lithographic.

13. A memory array comprising:

a number of memory cells forming an array with a number of rows and columns, each memory cell including an access transistor having body and first and second source/drain regions formed vertically, outwardly from a substrate and a gate disposed adjacent to a side of the transistor, the second source/drain region including an upper semiconductor surface;

a number of first isolation trenches separating adjacent rows of memory cells;

first and second word lines disposed in each of the first isolation trenches and coupled to alternate gates on opposite sides of the trench;

a number of second isolation trenches, each substantially orthogonal to the first isolation trenches and interposed between adjacent memory cells; and a number of body contacts disposed in the second isolation trenches that interconnect body regions of adjacent access transistors.

14. The memory array of claim 13, wherein the gates of the access transistors are each formed integral with one of the word lines.

15. The memory array of claim 13, wherein the pillars are disposed on a layer of insulator material.

16. The memory array of claim 13, wherein a surface area of the memory cell is $4F^2$, where F is a minimum feature size.

17. The memory array of claim 13, wherein the trench capacitors share a common second plate that surrounds the second source/drain region of each access transistor.

18. The memory array of claim 17, wherein the body contacts are coupled to the second plate of the trench capacitor.

19. The memory array of claim 13, wherein the body contacts are coupled to a decoder that provides a body bias to the body regions of the access transistors.

* * * * *